(12) United States Patent
Muralidhar et al.

(10) Patent No.: US 7,416,945 B1
(45) Date of Patent: Aug. 26, 2008

(54) METHOD FOR FORMING A SPLIT GATE MEMORY DEVICE

(75) Inventors: Ramachandran Muralidhar, Austin, TX (US); Rajesh A. Rao, Austin, TX (US); Matthew T. Herrick, Cedar Park, TX (US); Narayanan C. Ramani, Austin, TX (US); Robert F. Steimle, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/676,403

(22) Filed: Feb. 19, 2007

(51) Int. Cl.
  *H01L 21/336* (2006.01)
(52) U.S. Cl. .................. 438/267; 438/257; 257/315; 257/E21.645; 257/E27.081
(58) Field of Classification Search ............. 438/265, 438/255, 257, 211, 267, 268, 154, 158; 257/315, 257/E21.18, E21.209, E21.422, 324, E21.423, 257/E29.309; 977/938
See application file for complete search history.

(56) References Cited

U.S. PATENT DOCUMENTS

| | | | |
|---|---|---|---|
| 4,173,766 A | 11/1979 | Hayes | |
| 5,408,115 A | 4/1995 | Chang | |
| 5,585,293 A | 12/1996 | Sharma et al. | |
| 5,705,415 A | 1/1998 | Orlowski et al. | |
| 5,824,584 A | 10/1998 | Chen et al. | |
| 5,969,383 A | 10/1999 | Chang et al. | |
| 6,307,782 B1 | 10/2001 | Sadd et al. | |
| 6,330,184 B1 | 12/2001 | White et al. | |
| 6,399,441 B1 | 6/2002 | Ogura et al. | |
| 6,583,466 B2 | 6/2003 | Lin et al. | |
| 6,674,120 B2 | 1/2004 | Fujiwara | |
| 6,706,599 B1 | 3/2004 | Sadd et al. | |
| 6,713,812 B1 | 3/2004 | Hoefler et al. | |
| 6,751,125 B2 | 6/2004 | Prinz et al. | |
| 6,768,681 B2 | 7/2004 | Kim | |
| 6,800,526 B2 | 10/2004 | Lin et al. | |
| 6,816,414 B1 | 11/2004 | Prinz | |
| 6,818,512 B1 | 11/2004 | Hsieh | |
| 6,887,758 B2 | 5/2005 | Chindalore et al. | |
| 6,894,339 B2 | 5/2005 | Fan et al. | |

(Continued)

OTHER PUBLICATIONS

Osabe, T. et al.; "Charge-injection length in silicon nanocrystal memory cells"; 2004 Symposium on VLSI Technology Digest of Technical Papers; 2004; pp. 242-243; IEEE.

(Continued)

*Primary Examiner*—W. David Coleman
*Assistant Examiner*—Shaka Scarlett
(74) *Attorney, Agent, or Firm*—Robert L. King; David G. Dolezal

(57) ABSTRACT

A method forms a split gate memory device. A layer of select gate material over a substrate is patterned to form a first sidewall. A sacrificial spacer is formed adjacent to the first sidewall. Nanoclusters are formed over the substrate including on the sacrificial spacer. The sacrificial spacer is removed after the forming the layer of nanoclusters, wherein nanoclusters formed on the sacrificial spacer are removed and other nanoclusters remain. A layer of control gate material is formed over the substrate after the sacrificial spacer is removed. A control gate of a split gate memory device is formed from the layer of control gate material, wherein the control gate is located over remaining nanoclusters.

20 Claims, 16 Drawing Sheets

U.S. PATENT DOCUMENTS

| | | |
|---|---|---|
| 6,911,691 B2 | 6/2005 | Tomiie et al. |
| 6,960,527 B2 | 11/2005 | Kang |
| 6,964,902 B2 | 11/2005 | Steimle et al. |
| 6,972,997 B2 * | 12/2005 | Ishimaru et al. ........ 365/185.29 |
| 7,015,537 B2 | 3/2006 | Lee et al. |
| 7,112,480 B2 | 9/2006 | Pan et al. |
| 2002/0151136 A1 | 10/2002 | Lin et al. |
| 2003/0062585 A1 | 4/2003 | Andoh et al. |
| 2003/0068864 A1 | 4/2003 | Il-Yong et al. |
| 2003/0223299 A1 | 12/2003 | Wen et al. |
| 2004/0000688 A1 | 1/2004 | Harari et al. |
| 2004/0121540 A1 | 6/2004 | Lin |
| 2004/0183122 A1 | 9/2004 | Mine et al. |
| 2004/0238878 A1 | 12/2004 | Sato et al. |
| 2004/0248371 A1 | 12/2004 | Wang |
| 2005/0037576 A1 | 2/2005 | Chen et al. |
| 2005/0176202 A1 | 8/2005 | Hisamoto et al. |
| 2005/0191808 A1 | 9/2005 | Steimle et al. |
| 2005/0259475 A1 | 11/2005 | Forbes |
| 2005/0280089 A1 | 12/2005 | Forbes |
| 2005/0280094 A1 | 12/2005 | Forbes |
| 2006/0152978 A1 | 7/2006 | Forbes |
| 2006/0166443 A1 | 7/2006 | Forbes |
| 2007/0218633 A1 * | 9/2007 | Prinz et al. .................. 438/267 |

OTHER PUBLICATIONS

Lee, Dana et al.; "Vertical floating-gate 4.5F2 Split-gate NOR Flash Memory at 110nm Node"; 2004 Symposium on VLSI Technology Digest of Technical Papers; 2004; pp. 72-73; IEEE.

Guan, H. et al.; "An Analytical Model for Optimization of Programming Efficiency and Uniformity of Split Gate Source-Side Injection Superflash Memory"; IEEE Transactions on Electron Devices; Mar. 2003; pp. 809-815; vol. 50, No. 3; IEEE.

Hayashi, Y. et al.; "Twin MONOS Cell with Dual Control Gates"; 2000 Symposium on VLSI Technology Digest of Technical Papers; 2000; pp. 122-123; IEEE.

Chang, K. et al.; "A New SONOS Memory Using Source-Side Injection for Programming"; IEEE Electron Device Letters; Jul. 1998; vol. 19, No. 7; pp. 253-255; IEEE.

Van Houdt, J.; "An Analytical Model for the Optimization of Source-Side Injection Flash EEPROM Devices"; IEEE Transactions on Electron Devices; Jul. 1995; vol. 42, No. 7; pp. 1314-1320; IEEE.

Ma, Y. et al.; A Dual-bit Split-Gate EEPROM (DSG) Cell in Contactless Array for Single-Vcc High Density Flash Memories; IEDM 94-57; 1994; pp. 3.5.1-3.5.4; IEEE.

* cited by examiner

METHOD FOR FORMING A SPLIT GATE MEMORY DEVICE

BACKGROUND

1. Field

This disclosure relates generally to semiconductors, and more specifically, to semiconductor memories and the manufacture thereof.

2. Related Art

Split gate memory cells have found a particular use in non-volatile memories (NVMs) that have many applications. A split gate memory cell has two distinguishable channel regions, respectively controlled by a select gate and a control gate, which are electrically separated by a dielectric. The select gate channel acts as an access device to select the memory cell under the control gate during read or program operations. A particular concern in any memory device is to have a sufficient voltage differential between program and erase states. This voltage differential may be considered as a memory window for differentiating between program and erase modes. Efficient removal of electrons from the storage element(s) during an erase operation helps to increase the size of the memory window and therefore improve program and erase efficiency. In some split-gate memory structures a charge storage layer is used having nanoclusters which hold charge. It may be difficult to remove all electrons from some portions of a nanocluster layer. For example, complete removal of charge from the nanoclusters which lie in the dielectric between the select gate and the control gate or at a corner of the control gate that is closer to the select gate, may be difficult. Any residual charge left in a nanocluster layer that is close to a channel of a memory cell can result in a partially erased memory cell. Such partially erased memory cells result in variation in the threshold voltage distribution of the memory in the erased state.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
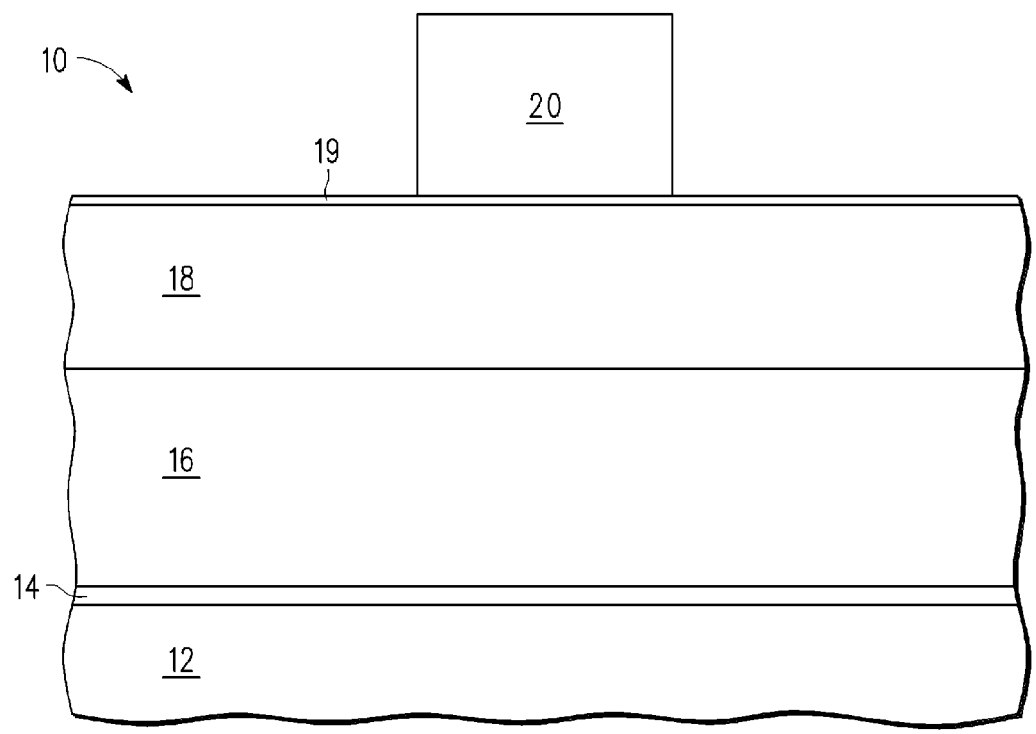
FIGS. 1-13 illustrate in cross-sectional form one form of a split gate memory device made in accordance with a first embodiment.

Illustrated in FIG. 1 is a cross-sectional view of a semiconductor memory device 10. A semiconductor substrate 12 is provided. The semiconductor substrate 12 described herein can be any semiconductor material or combinations of materials, such as gallium arsenide, silicon germanium, silicon-on-insulator (SOI), silicon, monocrystalline silicon, the like, and combinations of the above. Overlying the semiconductor substrate 12 is a dielectric layer 14 that functions as an insulating layer. In one form the dielectric layer 14 is an oxide and is thermally grown. In another form the oxide may be deposited on the semiconductor substrate 12. In other forms the dielectric layer 14 may be a high-K material or other conventional oxide materials. Overlying the dielectric layer 14 is a layer of select gate material 16. In one form the select gate material 16 is a polysilicon layer. In another form the select gate material 16 may be formed of any of various metals or metal alloys. Overlying the select gate material 16 is a nitride layer 18. By way of example only, relative thicknesses of the dielectric layer 14 and the select gate material 16 are the following: select gate material 16 is in a range of 100 to 150 nanometers and the nitride layer 18 is in a range of 100 to 200 nanometers. The dielectric layer 14 has a thickness in a range of a few nanometers. In another form it should be understood that a relatively thin oxide layer (not shown in this embodiment, but shown in a later embodiment) is formed between the select gate material 16 and the nitride layer 18. Overlying the nitride layer 18 is a relatively thin oxide layer 19 that is deposited onto the select gate material 16. Overlying a portion of the oxide layer 19 is a mask 20. The mask 20, in one form, is made of photoresist material.

Figure 2:
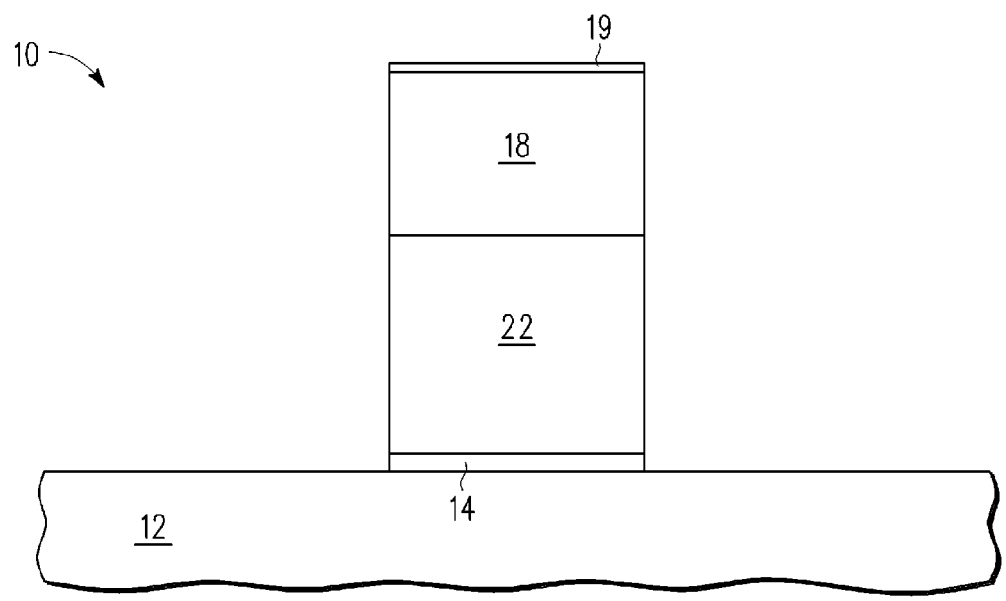

Illustrated in FIG. 2 is further processing of the memory device 10. An etch of the memory device 10 is performed. The etching is a conventional dry etch and will not be further detailed. As a result of etching the memory device 10, portions of the oxide layer 19, nitride layer 18, select gate material 16 and dielectric layer 14 are removed. A resulting stack of oxide layer 19, nitride layer 18, select gate material 16 and dielectric layer 14 is formed. The location of this stack structure as determined by the mask 20 determines the future location of a select gate 22 of the split gate memory cell that is being formed.

Figure 3:
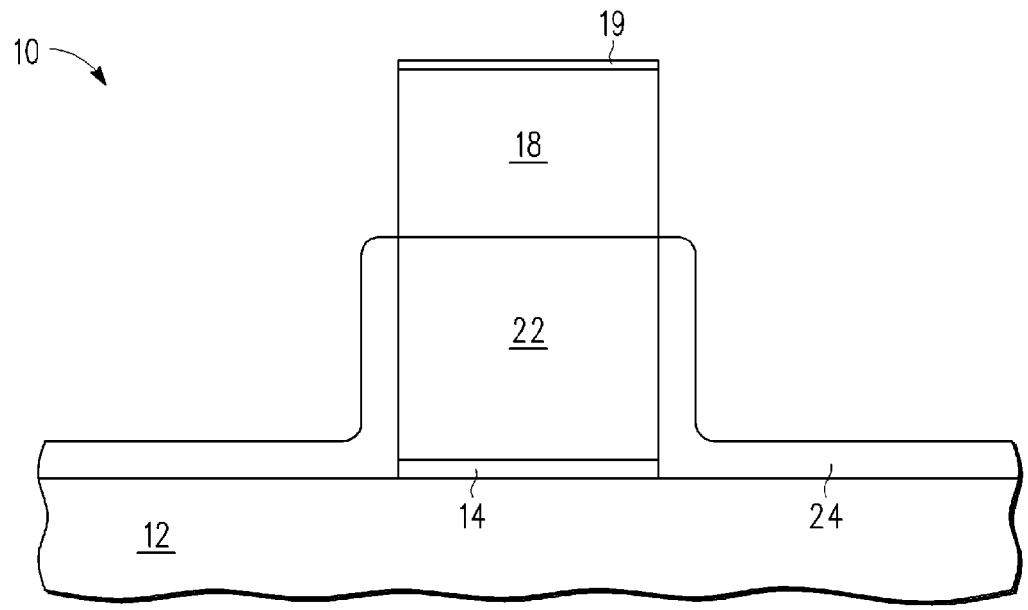

Illustrated in FIG. 3 is further processing of the memory device 10. A tunnel oxide is thermally grown in a conventional manner to form tunnel oxide 24 on all exposed silicon surfaces. As a result, the tunnel oxide 24 forms on the exposed surface of semiconductor substrate 12 and on the sidewalls of the select gate 22. In one form the tunnel oxide 24 may alternatively be formed as a deposited oxide layer that is conformal over the nitride layer 18 and oxide layer 19. In other forms the tunnel oxide 24 may be a high-K material or conventional oxide or nitrided oxide materials.

Figure 4:
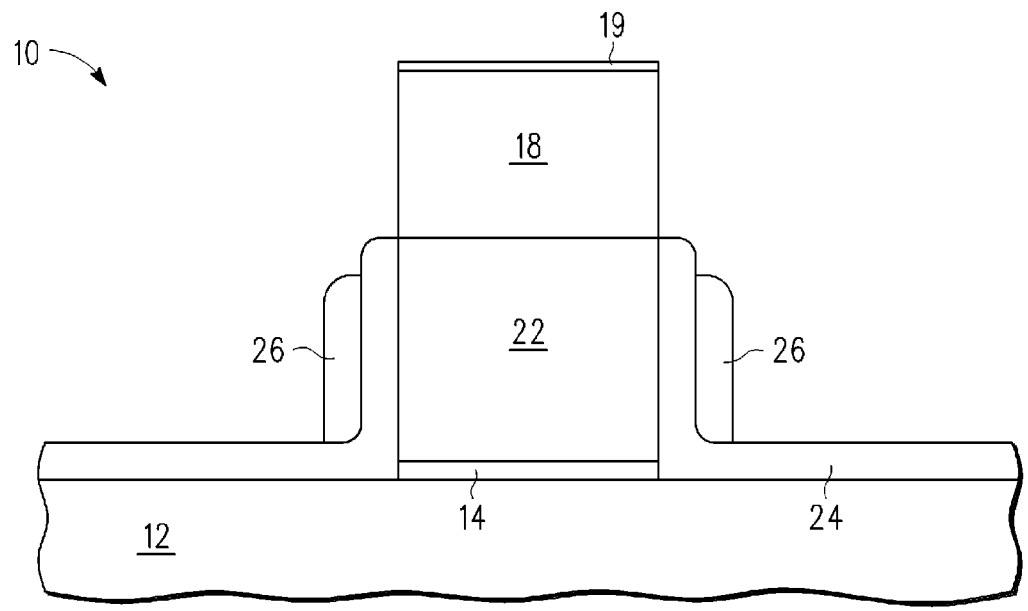

Illustrated in FIG. 4 is further processing of the memory device 10. A spacer 26 is formed by conformally depositing silicon nitride over memory device 10 and subsequently performing an anisotropic etch step. The spacer 26 therefore results on the outermost sidewalls of select gate 22. The lateral thickness of spacer 26 is controlled by the deposition time and is desired to have a predetermined minimum thickness. In one form the lateral thickness of spacer 26 is within a range of ten (10) nanometers to thirty (30) nanometers, but other values outside of this range may be used depending upon the processing geometries. The etching to form the spacer 26 should be explained further as there are several methods to perform this etch. In one form an etch step is used that is selective to all exposed oxide surfaces meaning that the etch step does not significantly affect any oxide surfaces. As a result, the exposed tunnel oxide 24 and oxide layer 19 keep substantially the same thicknesses as before the etch step. In case there is some damage to any of the exposed oxide surfaces, a dilute hydrofluoric (HF) wet etch may be used to remove damaged portions of the oxide and appropriate anneals may be performed to cure these surfaces. Examples of such post-etch treatments might be nitrogen or oxygen anneals or plasma treatments of the oxide using remote plasma sources.

The lateral thickness of the formed spacer 26 is relevant to note. The spacer 26 will be used as explained below to form an area where nanoclusters are not present.

In other forms, different materials other than nitride may be used to form spacer 26. Such materials include silicon germanium where the germanium content is approximately twenty-five percent (25%) of the spacer material. Another spacer material may be titanium nitride. Yet another material may be an amorphous carbon film. All three of these alternative materials may be etched using conventional anisotropic dry etch chemistries. While it is assumed that the spacer 26 is continuous around the select gate 22, it should be apparent that the spacer 26 does not have to be continuous and may be separated by one or more intervening materials.

Figure 5:
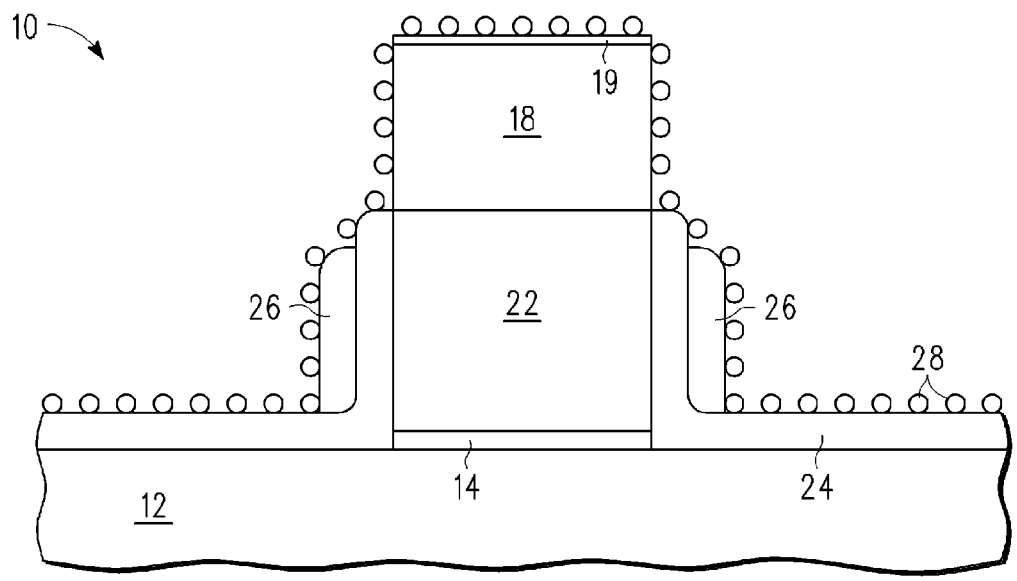

Illustrated in FIG. 5 is further processing of the memory device 10. A layer of nanoclusters 28 is formed on all exposed surfaces of the memory device 10. In one form the nanoclusters 28 are formed of silicon. It should be understood that other nanocluster materials may be used including tungsten, silicon germanium and others. It is expected that the nanoclusters 28 will be deposited on all exposed surfaces whether vertical or horizontal and independent of surface orientation. The nanoclusters are formed in a substantially uniform layer. It should be understood that the layer of nanoclusters 28 may be formed in any of various methods used to form nanoclusters. In one form the layer of nanoclusters 28 is formed by an low pressure chemical vapor deposition (LPCVD) method.

Figure 6:
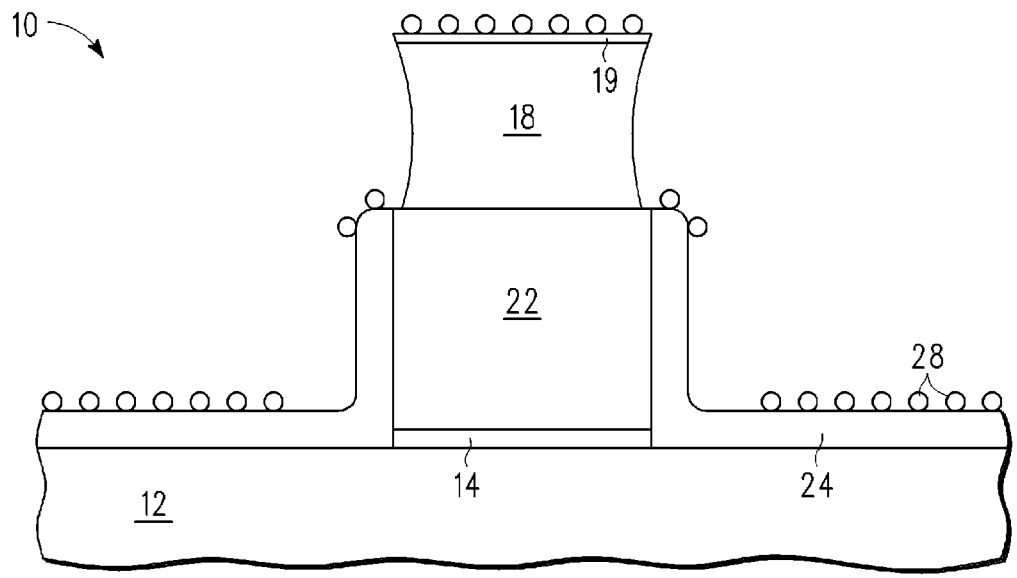

Illustrated in FIG. 6 is further processing of the memory device 10. Subsequent to the formation of the layer of nanoclusters 28, an etch step or removal of a portion of the nanoclusters 28 by the removal of spacer 26 is performed. Spacer 26 is removed by using a wet etch chemistry that is selective to the particular material that the spacer 26 is formed of while not etching any underlying tunnel oxide 24. For example, if the spacer 26 is formed of silicon nitride, a hot phosphoric acid bath may be used to remove the spacer 26 while leaving substantially undisturbed the underlying tunnel oxide 24 and any silicon nanoclusters 28 which do not overlie spacer 26. In order to protect the nanoclusters 28 from the hot phosphoric acid bath, the nanoclusters 28 may have a nitrided oxide layer (not shown) formed around the nanoclusters 28. The nitrided oxide layer functions to prevent silicon from being consumed by the hot phosphoric acid solution.

In the case of spacer 26 being implemented with any of the materials of titanium nitride, silicon germanium and amorphous carbon film, a piranha solution etch can be used to remove the spacer 26. Any of nanoclusters 28 that overlie the spacer 26 are also removed during this etch. The piranha solution etch has good selectivity to oxide and silicon and therefore no significant degradation to the nanoclusters 28 results.

It should be noted that the resulting memory device 10 does not have any nanoclusters of nanoclusters 28 remaining along most of the vertical sides of the tunnel oxide 24 adjacent to the select gate 22. Of particular value on the horizontal surface, nanoclusters have been removed adjacent the select gate 22 by an amount at least the length of the lateral width of spacer 26. As a result, nanoclusters on the horizontal surfaces of tunnel oxide 24 have a buffer zone of separation from the select gate 22. It may be noted that in the case of a nitride spacer, some lateral etching of nitride layer 18 results and is not expected to impact the performance of memory device 10. Thus, a portion of the nanoclusters 28, which may be difficult to completely erase and which may lead to variation in the threshold voltage distribution of the memory in the erased state, has been eliminated.

Figure 7:
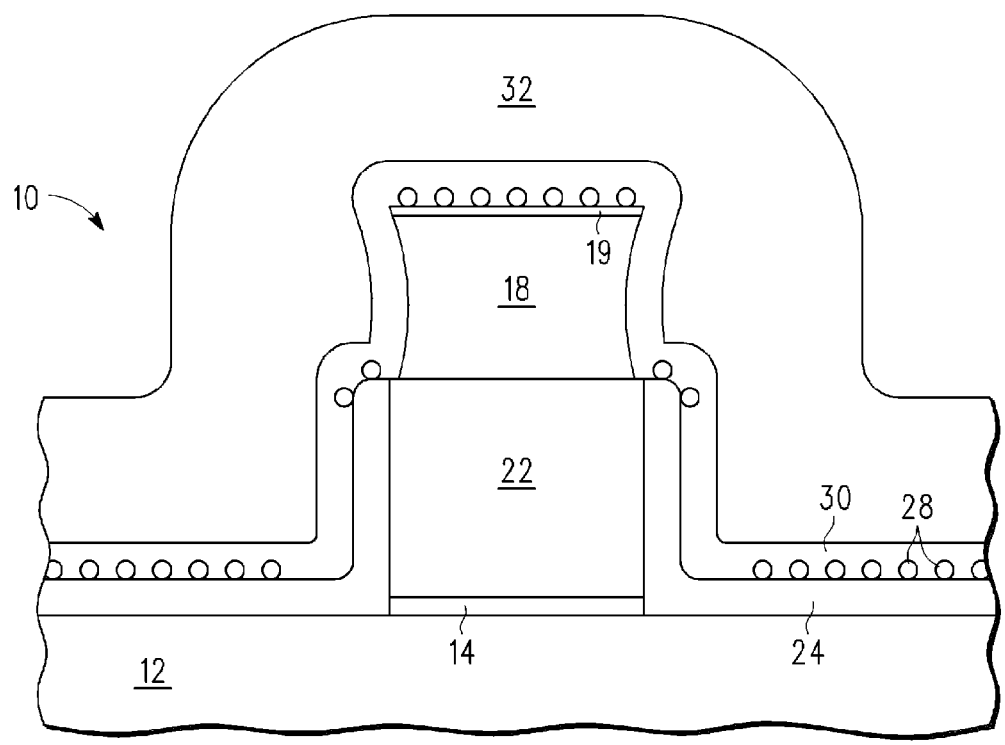

Illustrated in FIG. 7 is further processing of the memory device 10. A conformal oxide layer 30 is deposited overlying and adjacent the layer of nanoclusters 28. In one form oxide layer 30 has a thickness varying from five to twenty nanometers. In an alternate form the oxide layer 30 may be thermally grown around the nanoclusters 28. A conformal layer 32 of polysilicon is deposited overlying the memory device 10. The layer 32 has a thickness generally within a range of 100 nanometers to 200 nanometers. The thickness and subsequent etching of layer 32 determines the effective control gate length and therefore may be modified depending upon application needs.

Figure 8:
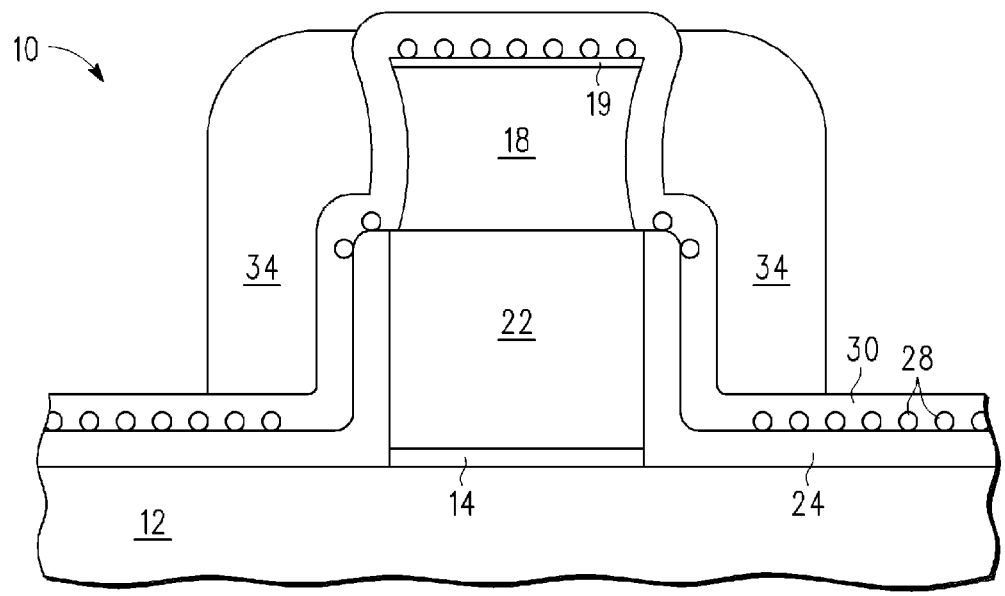

Illustrated in FIG. 8 is further processing of the memory device 10. In the illustrated form an anisotropic dry etch is performed to remove a portion of layer 32 that is above select gate 22. A remaining portion of layer 32 is left all around the select gate 22 to form a control gate structure 34 on the right-hand side of the select gate 22. The select gate 22 is separated laterally from the control gate structure 34 by the thickness of the tunnel oxide 24 and the oxide layer 30. It should be noted that a minimal amount of nanoclusters 28 are present to the side of control gate structure 34 between select gate 22 and control gate structure 34. However, a significant amount of nanoclusters 28 exists immediately below the control gate structure 34 to function as the charge storage layer for the control gate structure 34. Additionally, it should be noted that there is an omission or void of nanoclusters 28 at the adjoining left corner below the control gate structure 34 that is in close proximity to the semiconductor substrate 12.

Figure 9:
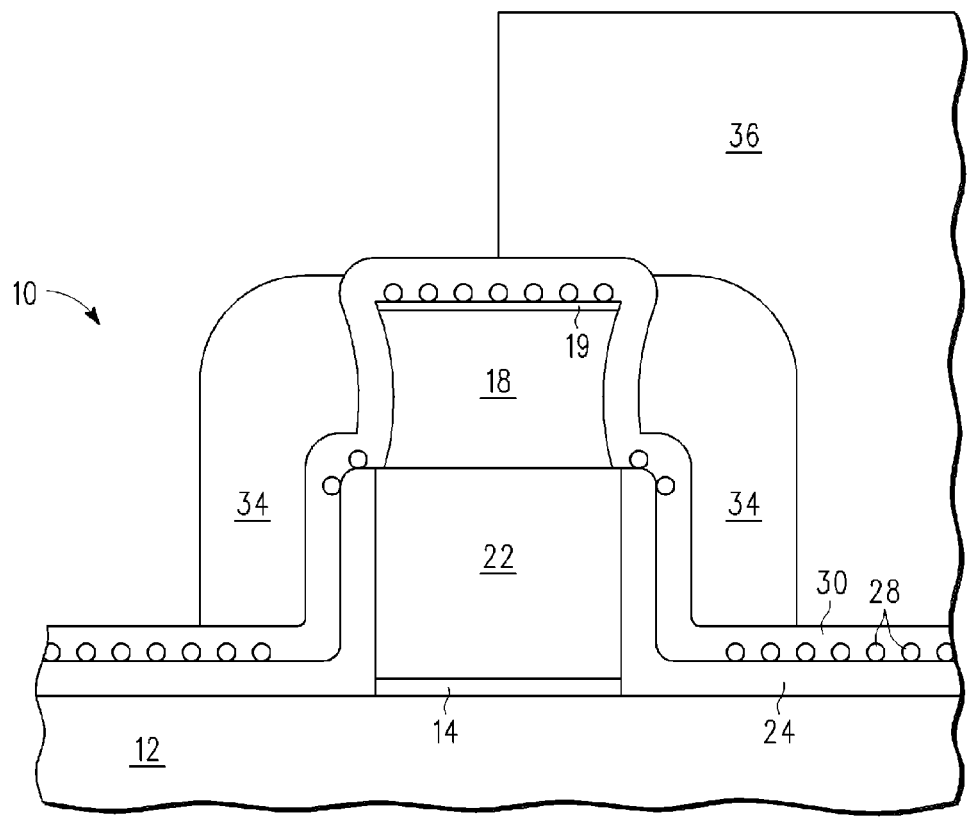

Illustrated in FIG. 9 is further processing of the memory device 10. A mask 36 is placed over a right-half portion of the memory device 10. The mask 36 is conventional and in one form is photoresist. The mask 36 also extends over approximately one-half of the select gate 22. With the mask in place an etch step is performed to remove the left portion of layer 32 selective to the underlying oxide. The etch step is a dry etch to remove the polysilicon of layer 32. Alternatively a wet etch may be used. Mask 36 is then removed.

Figure 10:
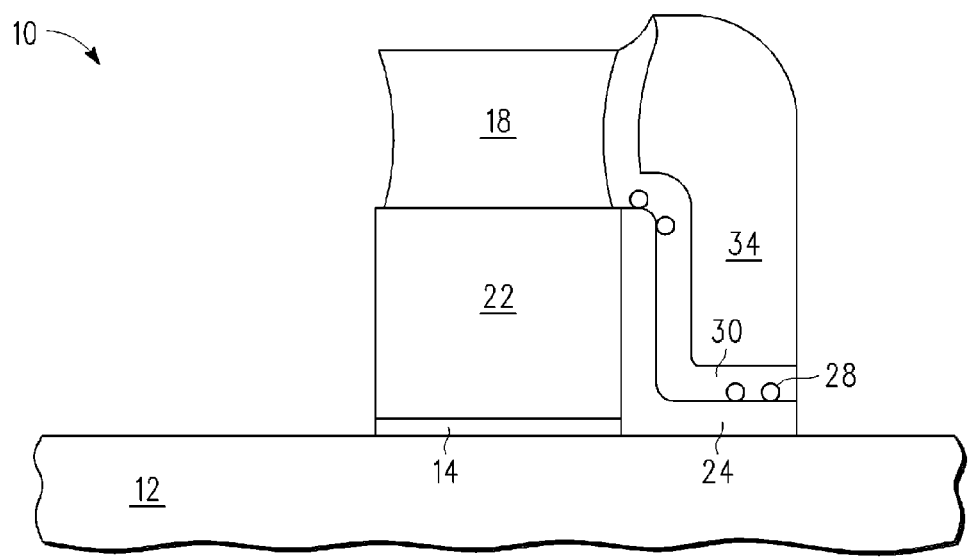

Illustrated in FIG. 10 is further processing of the memory device 10. All of the exposed nanoclusters 28 that are not underlying control gate structure 34 are removed by a wet etch step. The wet etch step can be an HF wet etch to dissolve the oxide and a standard clean one (SC1) etch is used to dislodge the remaining silicon nanoclusters 28 after the wet etch. The SC1 etch is conventional in semiconductor processing.

Figure 11:
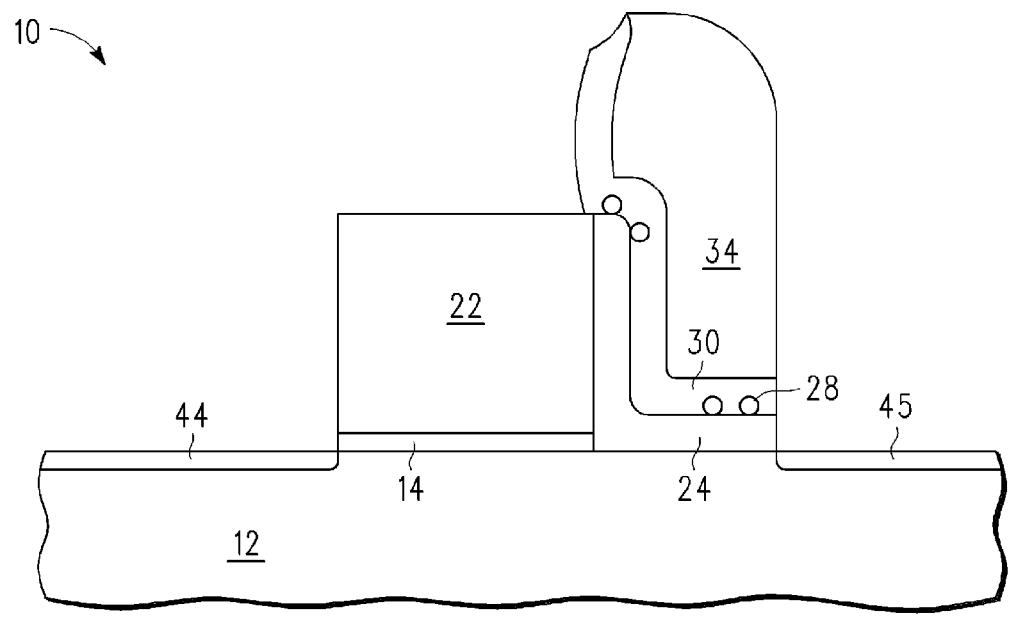

Illustrated in FIG. 11 is further processing of the memory device 10. A conventional hot phosphoric etch of nitride layer 18 is performed to remove nitride layer 18. To protect exposed surfaces of control gate structure 34 and select gate 22, a polysilicon oxidation step is performed. The selectivity of the hot phosphoric acid etch to nitride will result in the control gate structure 34 and the select gate 22 remaining intact after the etch step. Subsequently, an ion implant is performed to create lightly doped source/drain regions 44 and 45, respectively, within semiconductor substrate 12. The ion implant is self-aligning to the presence of the control gate structure 34 and select gate 22.

Figure 12:
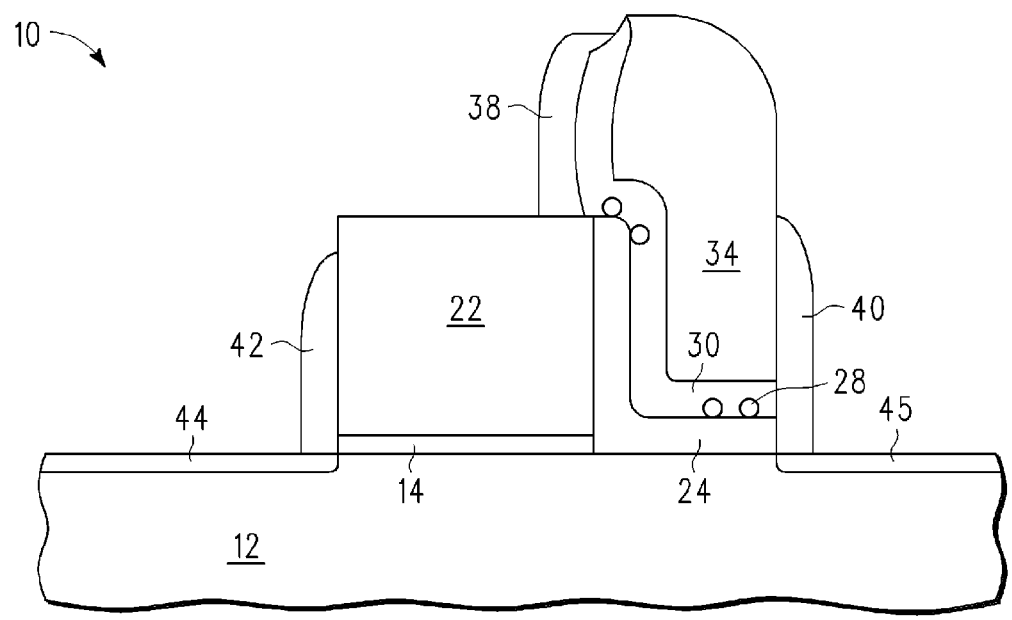

Illustrated in FIG. 12 is further processing of the memory device 10. Nitride spacers 38, 40 and 42 are formed by depositing nitride and performing an anisotropic etch. The formation of these spacers is conventional and will not be further detailed.

Figure 13:
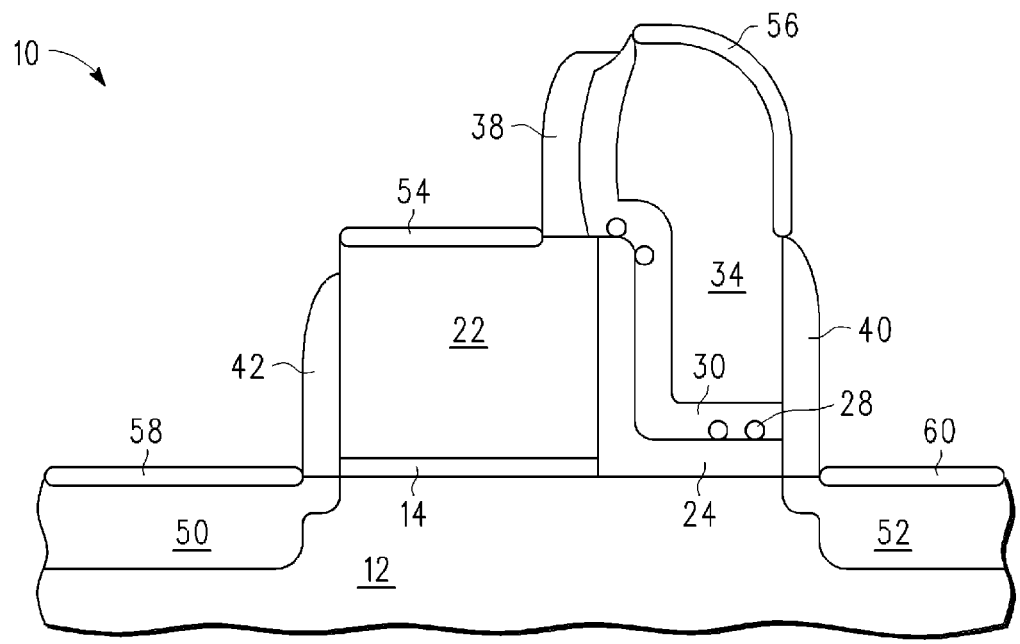

Illustrated in FIG. 13 is further processing of the memory device 10. Source/drain implants are made by conventional ion implant to form a source region 50 in semiconductor substrate 12 and a drain region 52 in semiconductor substrate 12. Each of the source region 50, the drain region 52, the control gate structure 34 and the select gate 22 has a silicide contact formed at an exposed surface thereof to make electrical contact to memory device 10. In particular, a silicide region 58 is formed at an upper surface of source region 50 for making electrical contact to source region 50. A silicide region 60 is formed at an upper surface of drain region 52 for making electrical contact to drain region 52. A silicide region 54 is formed at an upper surface of select gate 22 for making electrical contact to select gate 22. A silicide region 56 is formed at an upper surface of the control gate structure 34 for making electrical contact to the control gate structure. Therefore it should be apparent that there has been provided a method for forming a split gate memory device having a select gate 22 that is physically separated from the control gate structure 34. It should be noted that the charge storage layer of nanoclusters 28 that underlies the control gate structure 34 does not have any nanoclusters in the left-most corner region. We have noted that any nanoclusters present in this gap area or corner are difficult to erase with a conventional erase voltage. Nanoclusters in this corner region randomly couple to the control gate structure 34 and thus can cause fluctuations in device performance. The omission or void of nanoclusters in the left corner and immediately up the side of control gate structure 34 leads to more reliable erase operations of the memory device 1.

Figure 14:
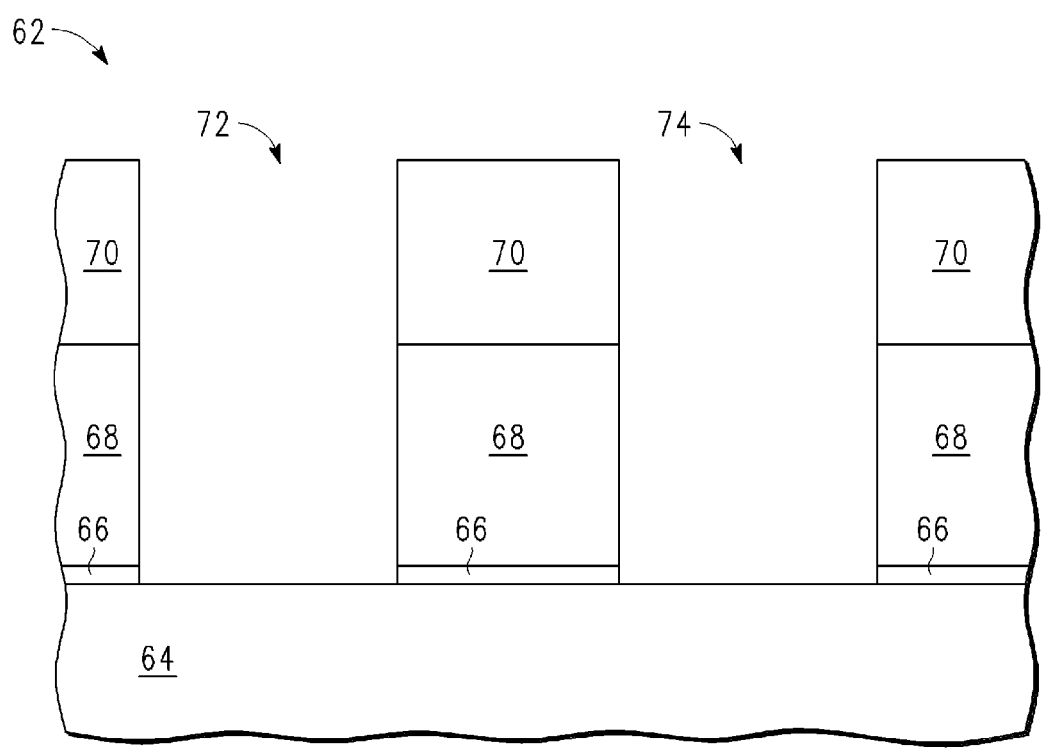
FIGS. 14-26 illustrate in cross-sectional form another form of a split gate memory device made in accordance with a second embodiment.
Figure 24:
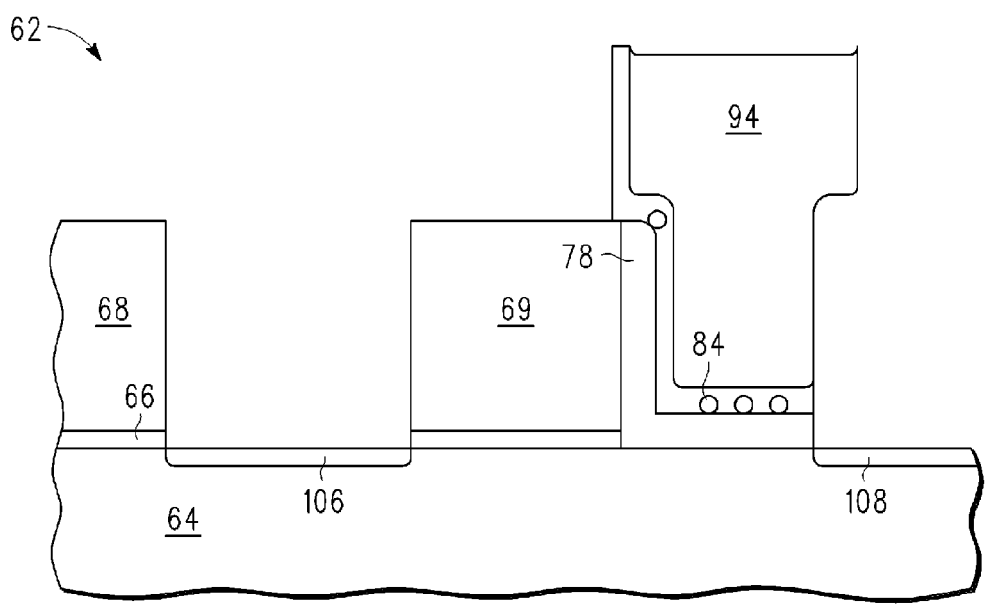

Illustrated in FIG. 14 is a memory device 62 formed in accordance with another embodiment. A semiconductor substrate 64 is provided. In one form the semiconductor substrate 64 is formed of silicon. In particular an oxide layer 66 for a select gate is formed by deposition. Overlying the oxide layer 66 is a layer 68 of select gate material. In one form the select gate material is polysilicon. Other conductive materials, including metals, may be used. Overlying the layer 68 is formed a nitride layer 70. In one form these layers are formed by deposition. After formation of the layers a trench 72 and a trench 74 are etched by a conventional dry etch. The trench 72 is formed to be wider than trench 74. The lateral dimensions of a select gate 69 to be identified below in FIG. 24 are thereby defined by the placement of the trenches 72 and 74. The trenches 72 and 74 remove a portion of the nitride layer 70, the layer 68 and the oxide layer 66 to expose portions of the semiconductor substrate 64.

Figure 15:
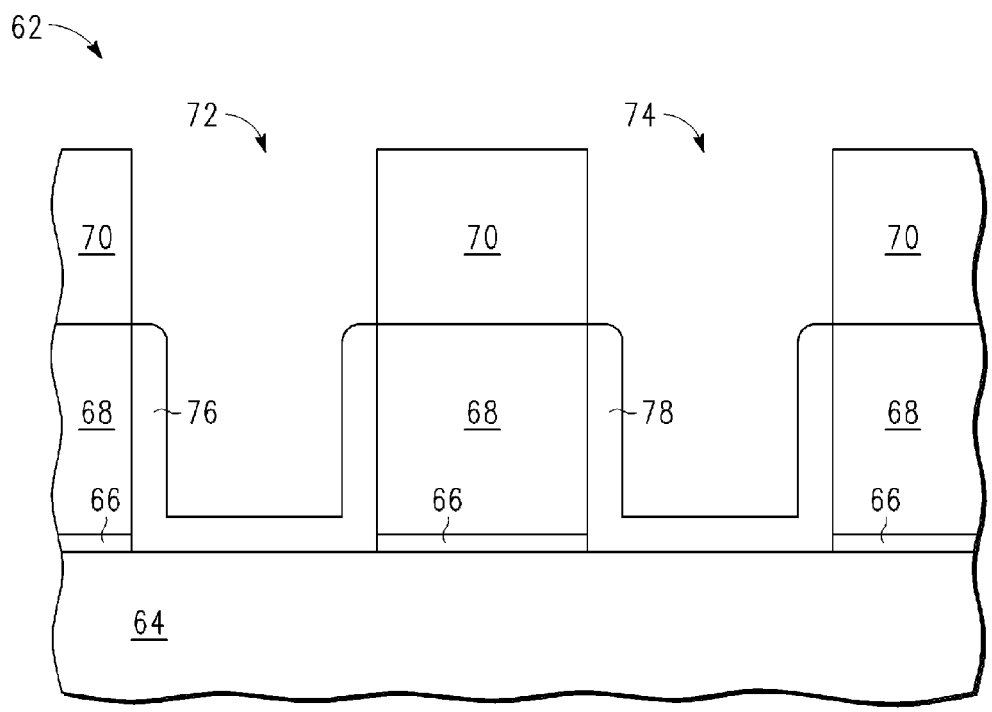

Illustrated in FIG. 15 is further processing of memory device 62 wherein a tunnel oxide 76 is thermally grown on exposed surfaces of layer 68 and oxide layer 66 within trench 72. Similarly, a tunnel oxide 78 is thermally grown on exposed surfaces of layer 68 and oxide layer 66 within trench 74. The tunnel oxide 76 and tunnel oxide 78 is selective and does not form on nitride layer 70.

Figure 16:
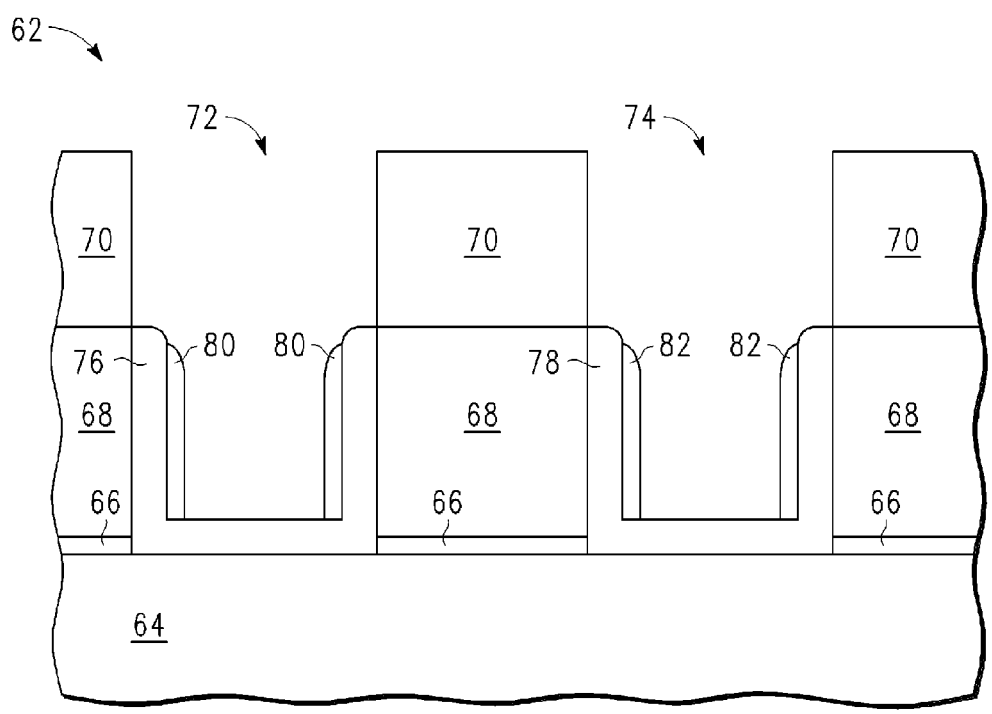

Illustrated in FIG. 16 is further processing of memory device 62 wherein a sacrificial spacer 80 is formed on the vertical sidewalls of the tunnel oxide 76 within trench 72. Similarly, a sacrificial spacer 82 is formed on the vertical sidewalls of the tunnel oxide 78. In one form the sacrificial spacers 80 and 82 are nitride spacers. In one form the sacrificial spacers 80 and 82 are formed by depositing a layer of nitride and performing a conventional anisotropic etch.

Figure 17:
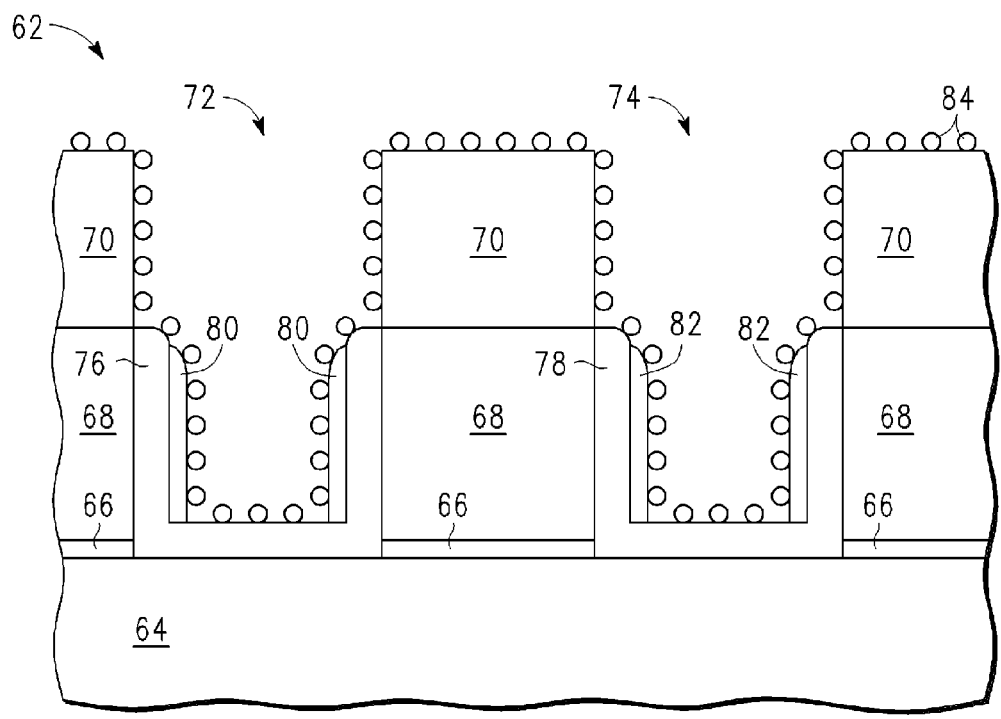

Illustrated in FIG. 17 is further processing of memory device 62 wherein a layer of nanoclusters 84 is conformally deposited. The nanoclusters 84 are in one form silicon nanoclusters although other materials may be used. The deposition of nanoclusters 84 covers all exposed horizontal and vertical surfaces.

Figure 18:
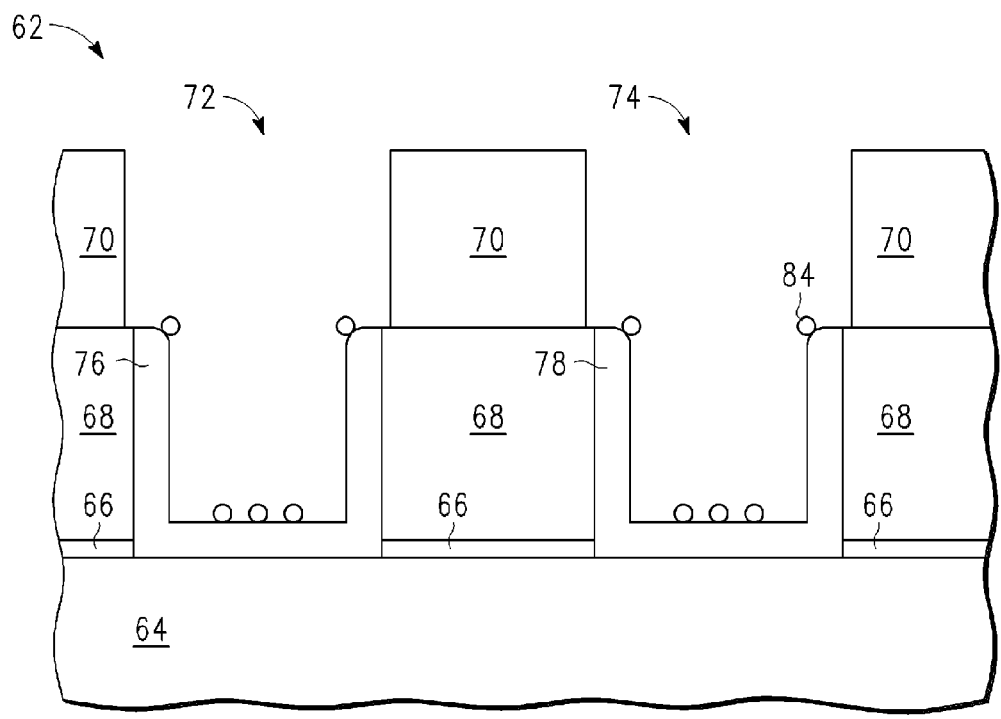

Illustrated in FIG. 18 is further processing of memory device 62 wherein the nanoclusters 84 are removed in all regions of the memory device 62 except on the bottom surface of each of trench 72 and trench 74 and any exposed area of tunnel oxides 76 and 78. The sacrificial spacers 80 and 82 are respectively removed from tunnel oxide 76 and tunnel oxide 78. This removal step is performed by a conventional hot phosphorous etch. As sacrificial spacers 80 and 82 are removed, the nanoclusters 84 attached to those sidewall spacers are also removed from memory device 62. This hot phosphorous etch will also remove the nanoclusters that are on the surface of the nitride layer 70 and also result in some etching of nitride layer 70. Therefore, the resulting structure has nanoclusters 84 only on the bottom trench surface of trenches 72 and 74 in contact with tunnel oxides 76 and 78 and on the upper rounded corners of the tunnel oxide 76 and tunnel oxide 78.

Figure 19:
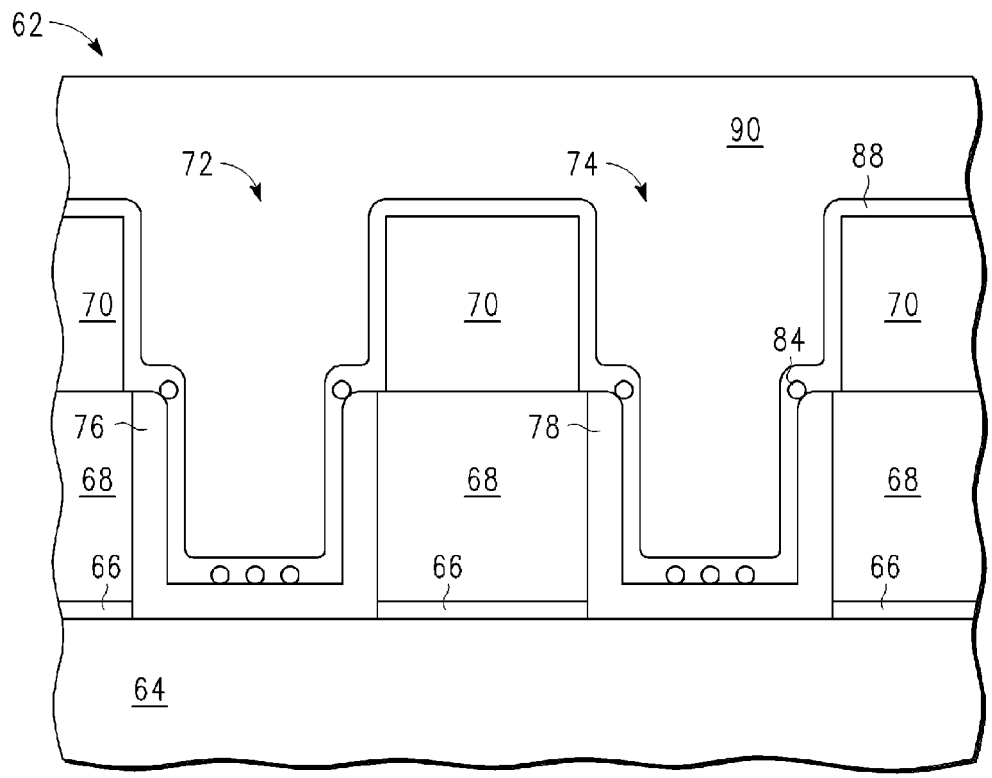

Illustrated in FIG. 19 is further processing of memory device 62 wherein a conformal oxide layer 88 is formed by deposition. The conformal oxide layer 88 covers all exposed surfaces of memory device 62 including the remaining nanoclusters 84. An overlying layer 90 of control gate material is deposited overlying the conformal oxide layer 88. The control gate material in one form is polysilicon. In other forms the control gate material may be a metal or any of various semiconductor materials.

Figure 20:
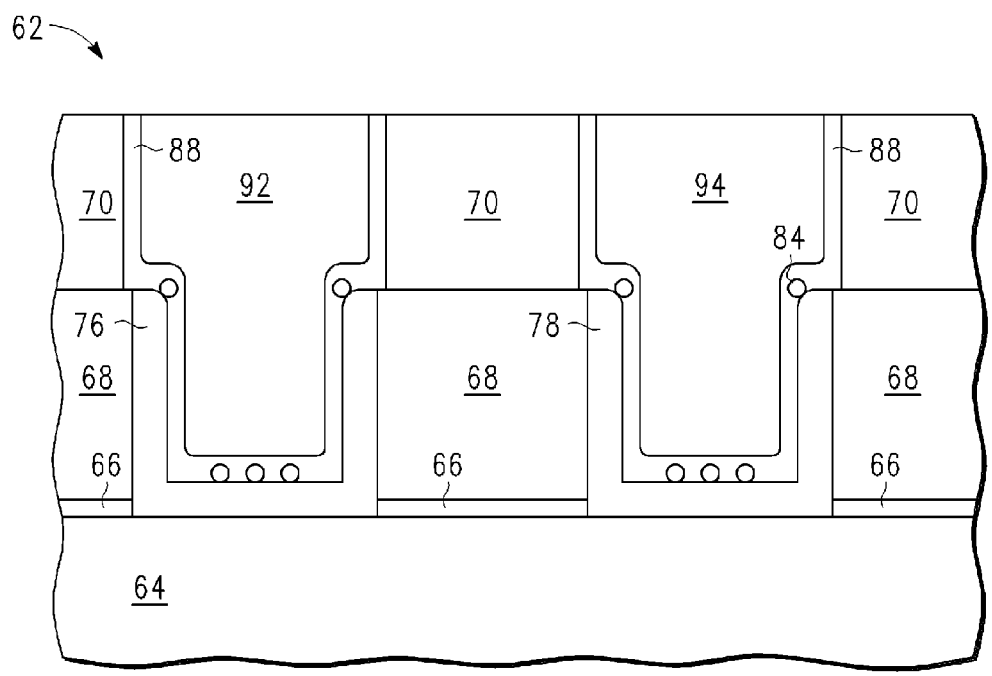

Illustrated in FIG. 20 is further processing of memory device 62. A chemical mechanical polish (CMP) polish step is performed to remove an upper portion of the layer 90 of control gate material and an upper portion of the oxide layer 88. The CMP polishing uses the nitride in nitride layer 70 as a polish stop to determine when the polishing should stop. As illustrated, the resulting structure of memory device 62 has a planar top surface and the layer 90 of control gate material has been separated to form a sacrificial control gate 92 and a control gate 94.

Figure 21:
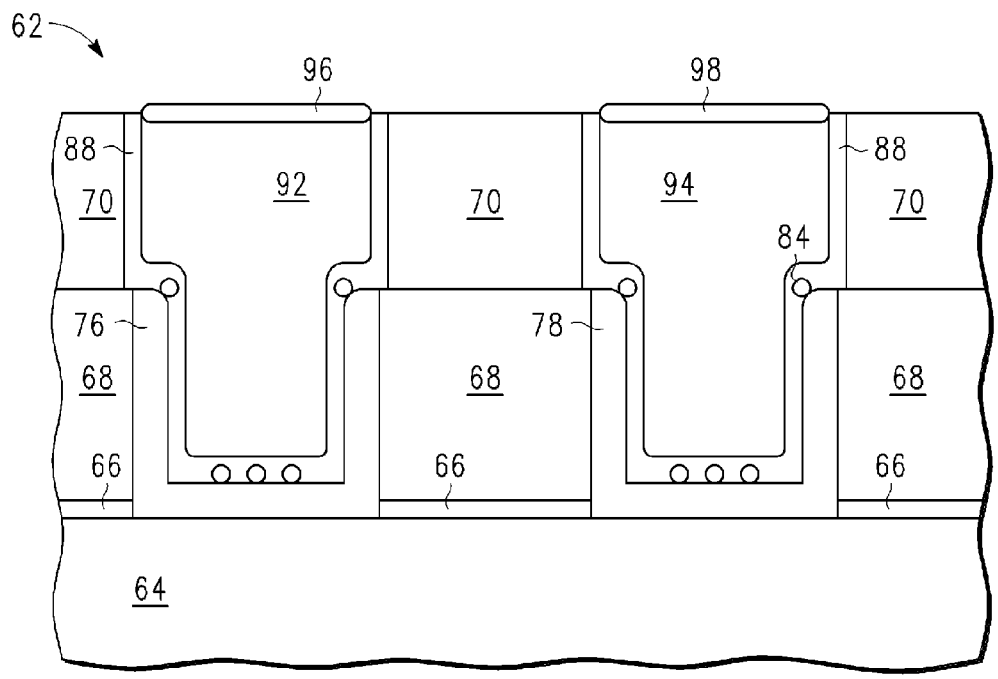

Illustrated in FIG. 21 is further processing of memory device 62. An oxide layer 96 is formed on and within the control gate material of sacrificial control gate 92. An oxide layer 98 is formed on and within the control gate material of control gate 94. The oxide layers 96 and 98 are formed by growing the oxide from the control gate material. In another form the oxide layers 96 and 98 are formed by conventional deposition.

Figure 22:
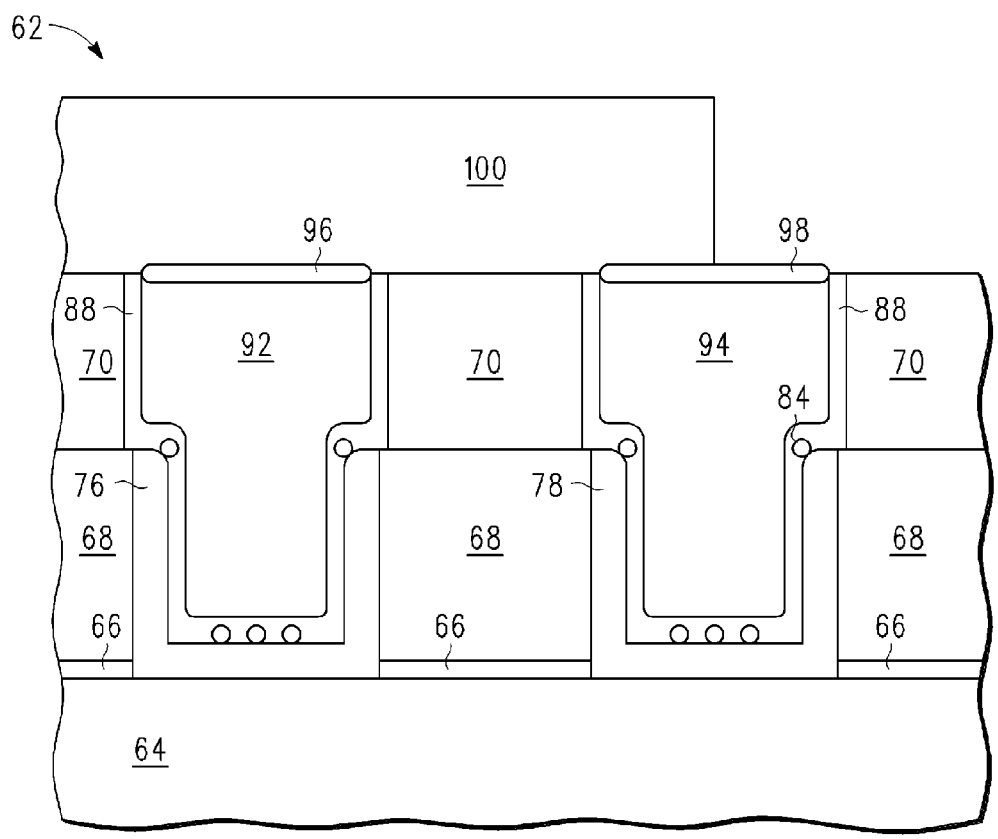

Illustrated in FIG. 22 is further processing of memory device 62. A mask 100 is placed over memory device 62 to completely cover the sacrificial control gate 92 and to cover approximately one-half of the control gate 94 that is closest to the sacrificial control gate 92. In one form the mask is provided by using a photoresist mask. Other types of masking materials may however be used. With the mask 100 in place a wet etch is performed to remove the exposed portion of nitride layer 70 and the subsequently exposed portion of layer 68 of select gate material which is typically polysilicon. This etch exposes a right-most portion of the select gate oxide layer 66.

Figure 23:
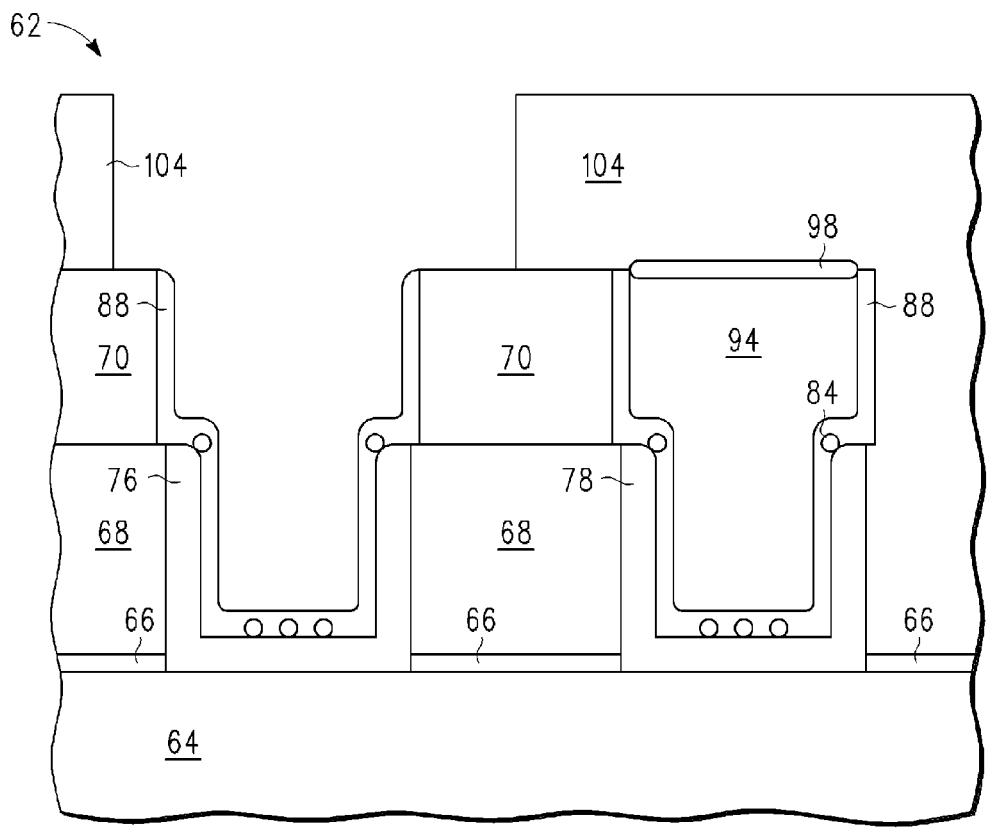

Illustrated in FIG. 23 is further processing of memory device 62 wherein the mask 100 has been removed and replaced with a mask 104 which is for example photoresist. Mask 104 leaves the sacrificial control gate 92 exposed and now masks the control gate 94 and portions of memory device 62 to the left of the opening. An etch is performed which selectively etches oxide layer 96 and does not etch the sacrificial control gate 92. The etch chemistry is then changed to etch the exposed sacrificial control gate 92 without removing the adjoining oxide layer 88. Conventional etch chemistries may be implemented in succession to selectively remove oxide layer 96 and sacrificial control gate 92.

Illustrated in FIG. 24 is further processing of memory device 62 wherein the mask 104 has been removed. A wet etch is performed that removes oxide layer 98, remaining portions of nitride layer 70, remaining portions of oxide layer 88 and exposed nanoclusters 84 within the sacrificial control gate region. The resulting structure is subjected to an ion implant and dopants are driven into the semiconductor substrate to form lightly doped drain regions 106 and 108.

Figure 25:
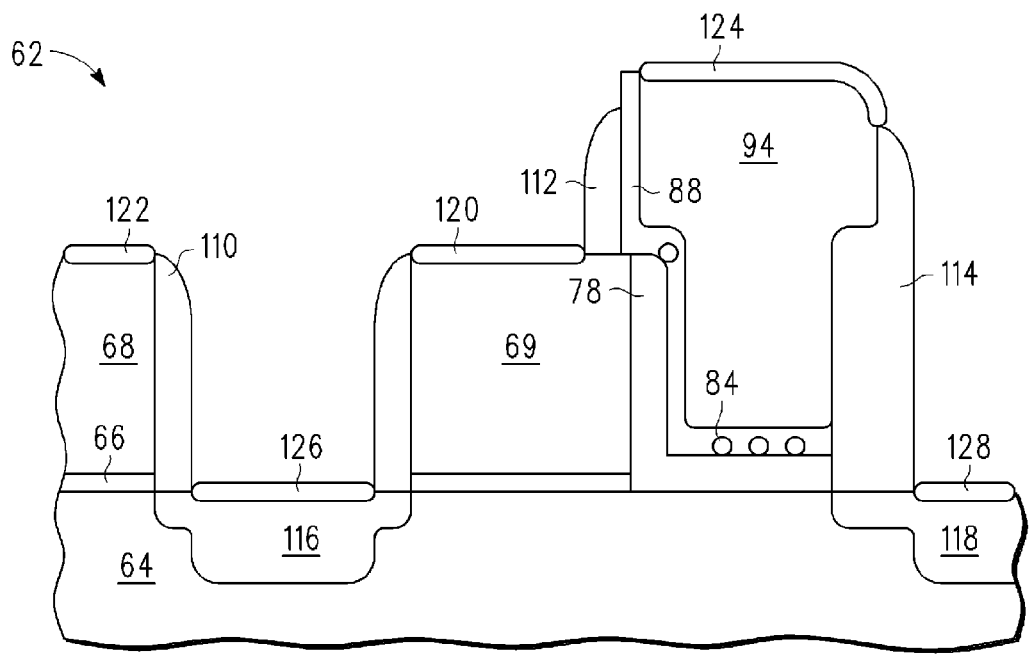

Illustrated in FIG. 25 is final processing of memory device 62 wherein nitride sidewall spacers are formed. A spacer 110 is formed and a spacer 112 is formed. Additionally a spacer 114 is formed. All of these spacers are nitride spacers and are formed on exposed surfaces of polysilicon. The nitride spacer formation process is conventional and will not be detailed herein. With spacers 110 and 114 present an ion implant is performed to form a source 116 and a drain 118 from the previously formed lightly doped drain regions 106 and 108, respectively. Additionally, layer 68 has electrical contact thereto formed by the formation of an overlying silicide region 122. Control gate 94 has electrical contact thereto formed by the formation of an overlying silicide region 124. The source 116 has electrical contact thereto formed by the formation of an overlying silicide region 126. The drain 118 has electrical contact thereto formed by the formation of an overlying silicide region 128.

It should be appreciated that memory device 62 is a split gate memory having a select gate 69 and a control gate 94. The charge storage region provided by nanoclusters 84 does not have any nanoclusters located in the left-most region of the lower section of oxide layer 88. The absence of nanoclusters in this area avoids the previously discussed partial erase memory condition which can become a problem in conventional split gate memories. While a few nanoclusters may exist in the upper area of oxide layer 88, such nanoclusters are sufficiently removed from the device's channel region as to have no effect on the integrity of an erase operation. The channel of memory device is located in the upper portion of semiconductor substrate between the source 116 and the drain 118.

Figure 26:
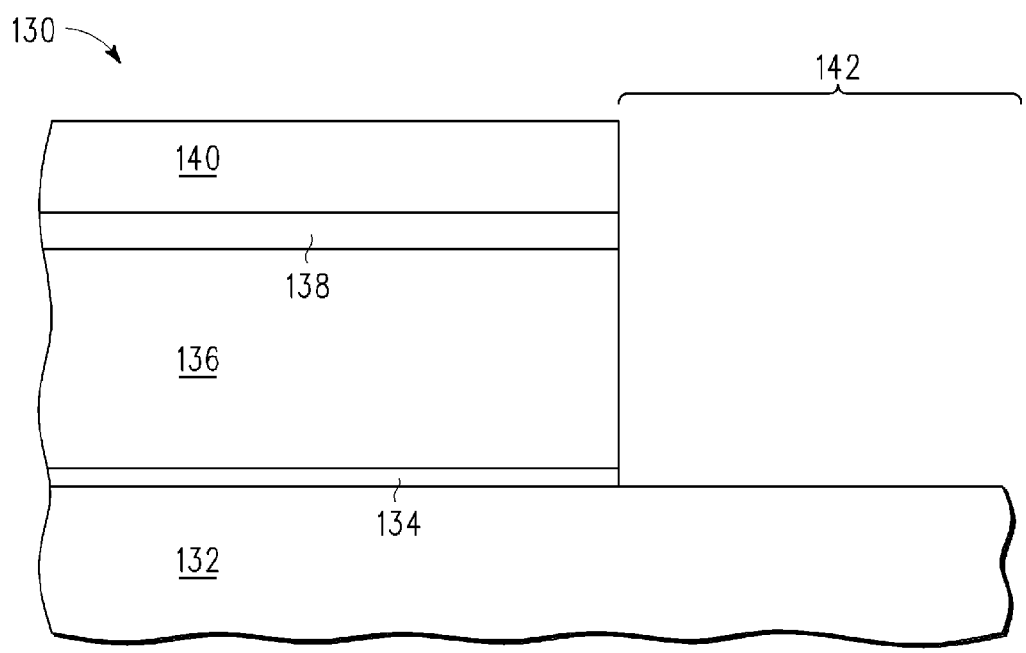

Illustrated in FIG. 26 is a memory device 130 formed in accordance with another embodiment described herein. A semiconductor substrate 132 is provided. An overlying gate oxide layer 134 is provided. Overlying the gate oxide layer 134 is a layer 136 of select gate material. Overlying the layer 136 is a dielectric layer 138. The dielectric layer 138 is either a nitride or an oxide. Overlying the dielectric layer 138 is a nitride layer 140 which functions as a protective cap and is an antireflective coating. A portion of these layers is removed above the semiconductor substrate 132 to form an area 142 that will define the location of the control gate to be subsequently formed.

Figure 27:
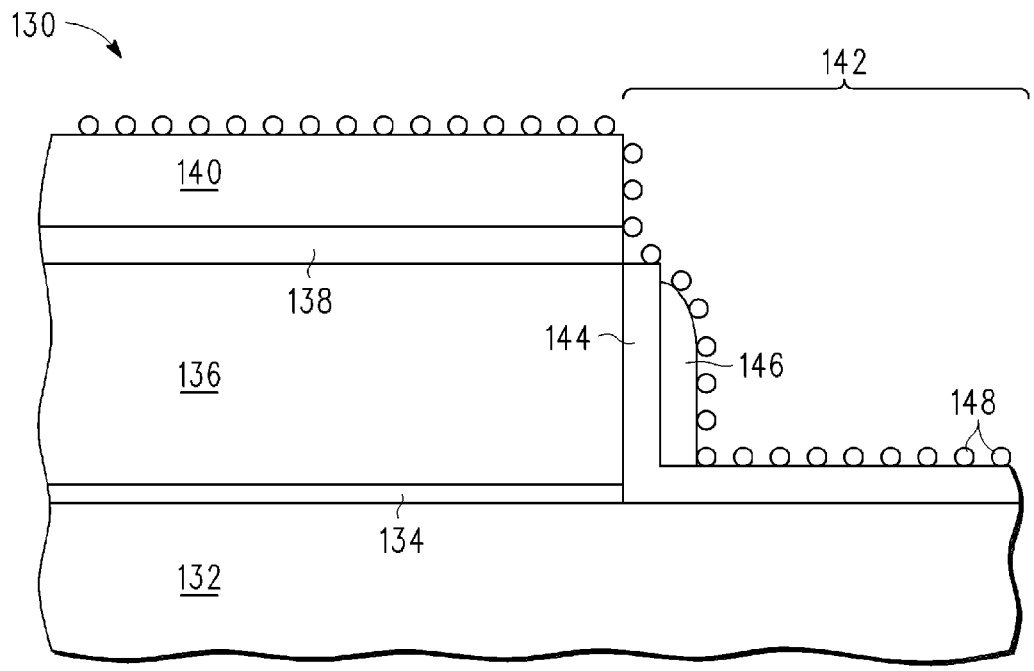
FIGS. 27-32 illustrate in cross-sectional form yet another form of a split gate memory device made in accordance with yet another embodiment.

Illustrated in FIG. 27 is memory device 130 in which tunnel oxide 144 is grown from the exposed layer 136 of select gate material and the semiconductor substrate 132. A sacrificial sidewall spacer 146 is formed adjacent the exposed vertical side of the tunnel oxide 144. At this point in the processing a layer of nanoclusters 148 is formed overlying all of the exposed surfaces of memory device 130. In one form silicon nanoclusters are deposited.

Figure 28:
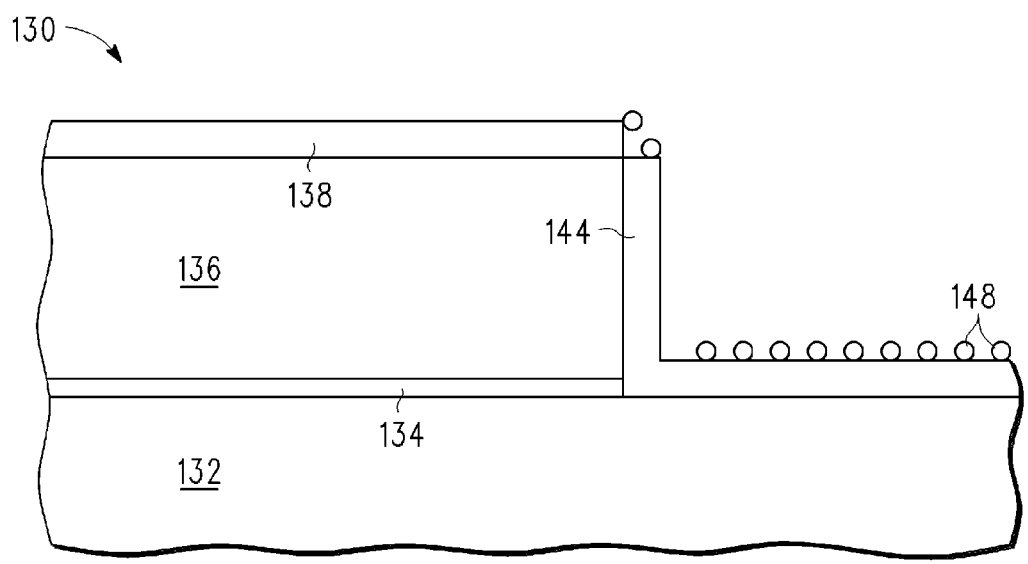

Illustrated in FIG. 28 is further processing of memory device 130 in which the sacrificial sidewall spacer 146 is removed which removes all adjoining nanoclusters that are in contact with the spacer 146. Additionally, the nitride layer 140 is removed which further removes all of the nanoclusters that were attached to the nitride layer 140. The nitride layer 140 is removed by a wet etch. The resulting structure at this point in the processing has nanoclusters only along the horizontal surfaces of tunnel oxide 144 and along the previously exposed side of the dielectric layer 138.

Figure 29:
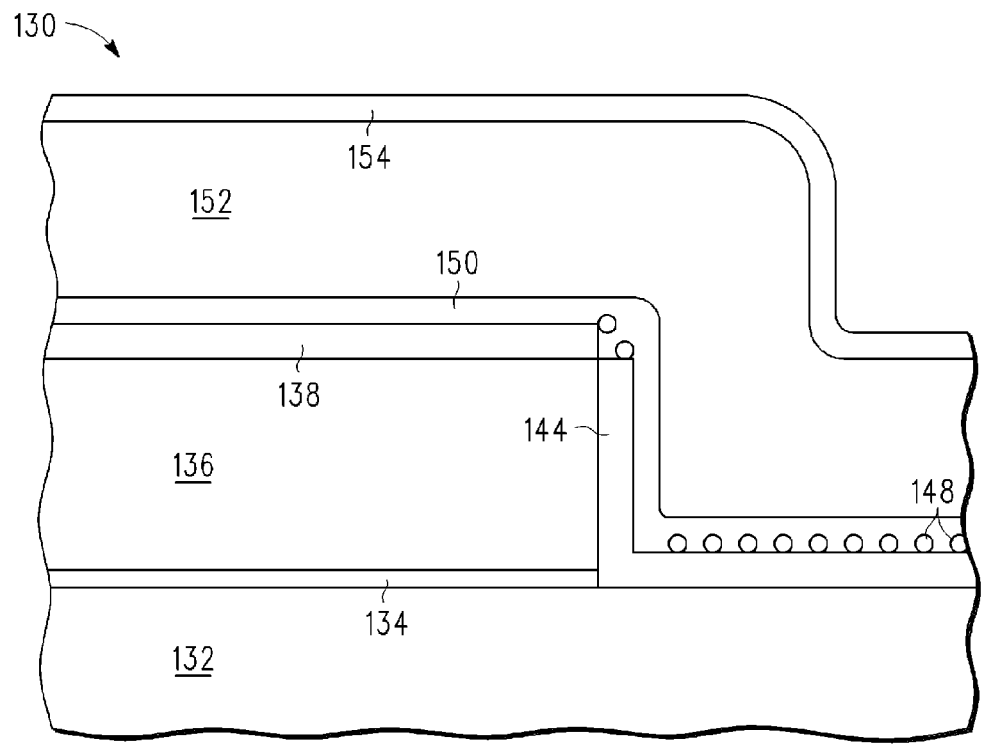

Illustrated in FIG. 29 is further processing of memory device 130 in which a conformal layer of oxide 150 is deposited around the nanoclusters 148. Overlying the layer of oxide 150 is a layer 152 of control gate material. In one form the control gate material is polysilicon, but metal or other semiconductor materials may be used. Overlying the layer 152 is a conformal nitride layer 154 that functions as an antireflective coating.

Figure 30:
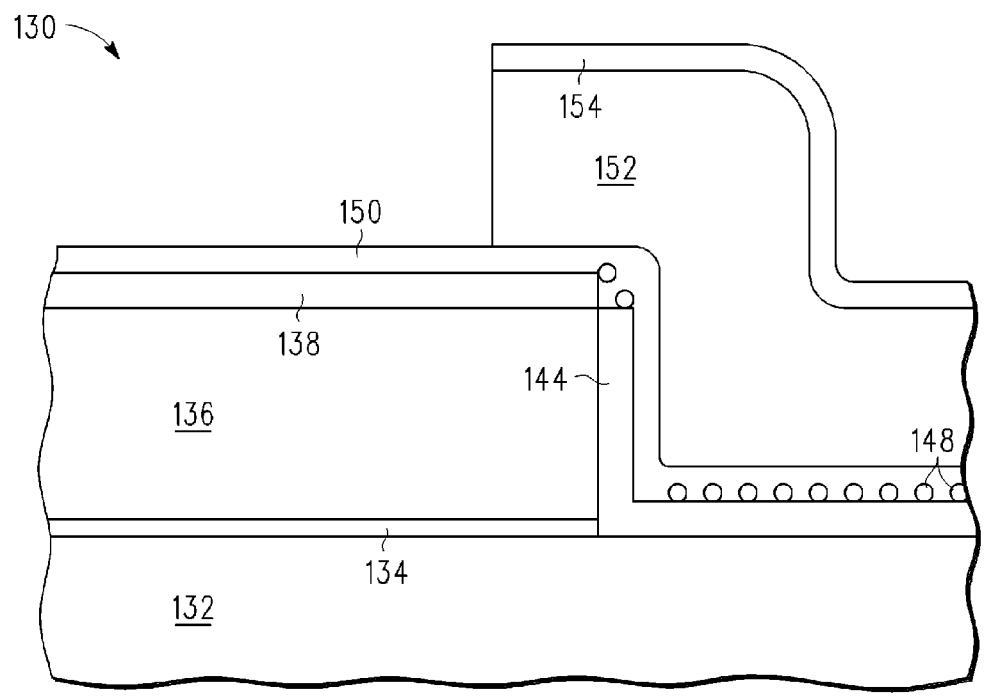

Illustrated in FIG. 30 is further processing of memory device 130 in which a mask (not shown) is used to etch away a portion of the nitride layer 154 and the layer 152. A conventional dry etch is used to remove these layers.

Figure 31:
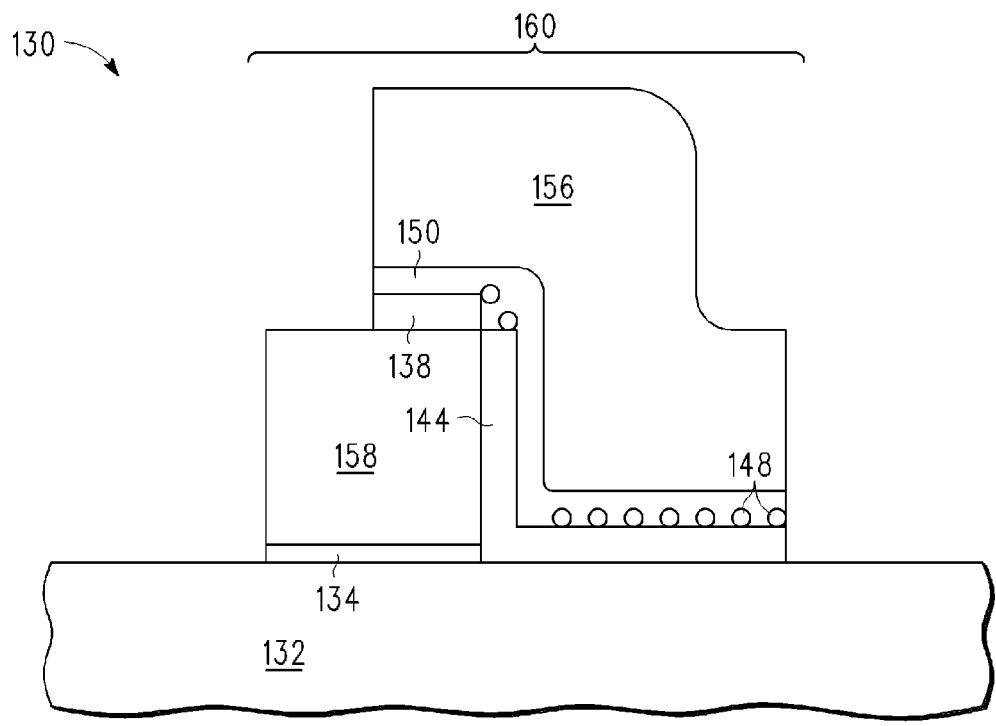

Illustrated in FIG. 31 is further processing of memory device 130 in which another mask (not shown) is used to further etch the nitride layer 154 and exposed portions of the layer of oxide 150, the dielectric layer 138, the layer 136 of select gate material and the gate oxide 134. A conventional wet etch is used to remove oxide material. An area 160 is the area which is masked off. As a result, the previous layer 136 of select gate material becomes a select gate 158. The previous layer 152 of control gate material becomes a control gate 156. It should be noted that the gate structure of a split gate transistor which functions as a memory cell has now been formed. As with the previous embodiments, it should be noted that the storage layer of nanoclusters 148 does not contain nanoclusters adjacent or in the bottom left corner of the storage layer. As a result, residual charge is not contained in this area after an erase operation and reliable erases may be implemented.

Figure 32:
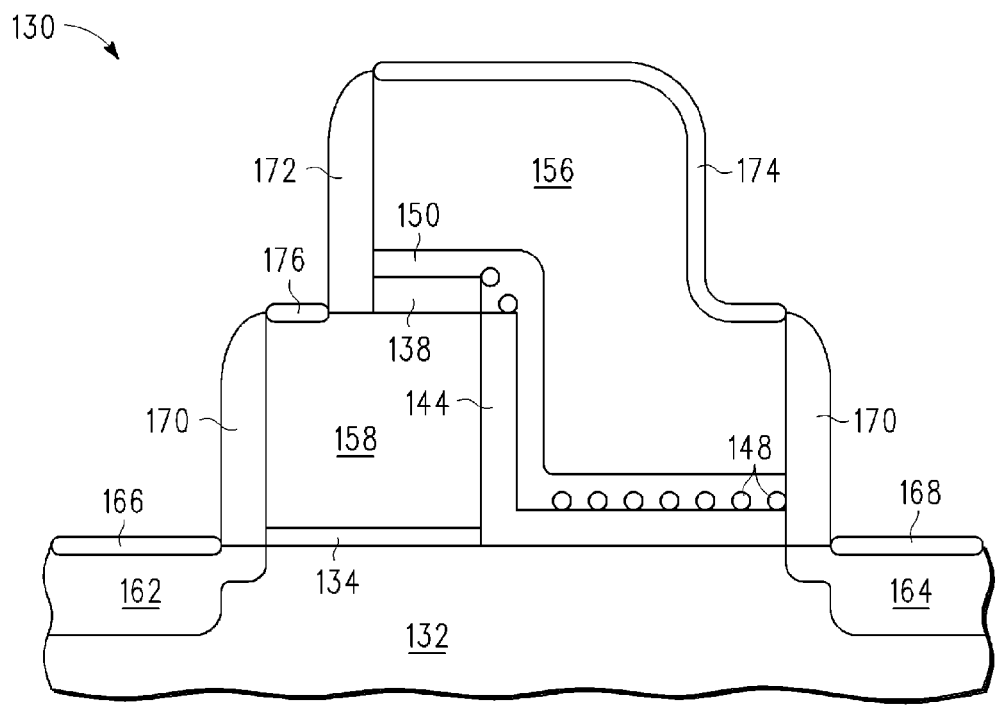

Illustrated in FIG. 32 is completed processing of the memory device 130. Source region 162 and drain region 164 are formed by forming lightly doped drains with an ion implant. Conventional sidewall spacers 170 and 172 are formed and the source region 162 and drain region 164 are then formed. Silicide regions 166, 168, 174 and 176 are formed at the exposed conductive surfaces of the memory device's terminals. A completed transistor memory cell has thus been provided.

Although the invention is described herein with reference to specific embodiments, various modifications and changes can be made without departing from the scope of the present invention as set forth in the claims below. For example, various forms of nanoclusters may be used in which some are crystalline and some non-crystalline. Additionally, the nanoclusters may assume various shapes and sizes. The spherical shapes represented herein are done so solely for convenience of illustration. Various semiconductor processing technologies may implement the split gate memory cell described herein such as bipolar and GaAs devices in addition to MOS devices. The teachings provided herein are applicable for any range of processing geometries. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

In one form there is herein provided a method of forming a split gate memory device. A layer of select gate material is formed over a substrate. The layer of select gate material is patterned to form a first sidewall. A sacrificial spacer is formed adjacent to the first sidewall. A layer of nanoclusters is formed over the substrate including on the sacrificial spacer. The sacrificial spacer is removed after the forming the layer of nanoclusters, wherein the removing removes nanoclusters of the layer of nanoclusters formed on the sacrificial spacer and leaves other nanoclusters of the layer of nanoclusters. A layer of control gate material is formed over the substrate after the removing the sacrificial spacer. A control gate of a split gate memory device is formed from the layer of control gate material, wherein the control gate is located over nanoclusters of the layer of nanoclusters. In one form a layer of dielectric material is formed over the layer of nanoclusters after the removing and prior to the forming the layer of control gate material. In another form a layer of dielectric material is formed on the first sidewall prior to the forming the sacrificial spacer. In another form the forming of a layer of dielectric material on the first sidewall includes growing an oxide layer on the first sidewall by oxidizing material of the first sidewall. In yet another form the forming of the layer of dielectric material includes forming a layer of dielectric material over the substrate in a first area adjacent to the first sidewall and where the layer of select gate material has been removed. The sacrificial spacer is formed in the first area on the layer of dielectric material. The forming the layer of nanoclusters includes forming nanoclusters on the layer of dielectric material in a second area of the first area adjacent to the sacrificial spacer. The removing leaves nanoclusters of the layer of nanoclusters in the second area. In another form the split gate memory storage device includes a charge storage structure including nanoclusters of the layer of nanoclusters in the second area. In yet another form the forming the sacrificial spacer includes forming a layer of spacer material on the layer of dielectric material. In another form the removing includes etching the sacrificial spacer with an etch chemistry that is selective to a material of the sacrificial spacer and does not etch a material of the dielectric layer.

In another form the forming of a sacrificial spacer includes forming a sacrificial spacer that includes a nitride. In another embodiment the forming of a sacrificial spacer includes forming a sacrificial spacer that includes titanium nitride. In another form the forming of a sacrificial spacer includes forming a sacrificial spacer that includes silicon nitride. In yet another form forming the sacrificial spacer includes forming a sacrificial spacer that includes silicon germanium. In another form nanoclusters formed on the sacrificial spacer are absorbed into the sacrificial spacer prior to the removing. In another form forming the sacrificial spacer includes forming a sacrificial spacer that includes amorphous carbon. In one form the nanoclusters include silicon. In another form the patterning the layer of select gate material forms a second sidewall. The second sidewall is an opposite sidewall to the first sidewall. The first sidewall defines a first sidewall of a select gate of the split gate memory device and the second sidewall defines a second sidewall of the select gate. In another form the control gate includes a base portion, wherein no nanoclusters of the layer of nanoclusters are located between the base portion and the first sidewall.

In another form there is herein provided a method of forming a split gate memory device by forming a first layer of dielectric material over a substrate. A layer of select gate material is formed over the first layer of dielectric material. A select gate of a split gate memory device is formed from the layer of select gate material wherein the forming a select gate includes patterning the layer of select gate material to form a first sidewall. The patterning removes the layer of select gate material in a first area adjacent to the first sidewall. A second dielectric layer is formed on the first sidewall, and a sacrificial spacer is formed on the second dielectric layer. A layer of nanoclusters is formed over the substrate including on the sacrificial spacer. The sacrificial spacer is removed with an etch chemistry that is selective to a material of the sacrificial spacer and does not etch a material of the second dielectric layer, wherein the removing removes nanoclusters of the layer of nanoclusters formed on the sacrificial spacer and leaves nanoclusters of the layer of nanoclusters formed in a second area of the first area outside a location of the sacrificial spacer. A charge storage structure of the split gate memory device includes nanoclusters of the layer of nanoclusters in the second area. A layer of control gate material is formed over the substrate after the removing including over the nanoclusters of the layer of nanoclusters in the second area. A control gate of the memory device is formed from the layer of control gate material.

In another form there is provided a method of making a semiconductor device by patterning a wafer to form a first sidewall and a lower surface in a first area adjacent to the first sidewall. A first dielectric layer is formed on the first sidewall and over the lower surface. A sacrificial spacer on the first dielectric layer is formed adjacent to the first sidewall in the first area. A layer of nanoclusters is formed on the wafer including on the sacrificial spacer and over a second area of the first area located adjacent to the sacrificial spacer. The sacrificial spacer is removed using an etch chemistry that is selective to a material of the sacrificial spacer and does not etch a material of the first dielectric layer, wherein the removing removes nanoclusters of the layer of nanoclusters formed on the sacrificial spacer and leaves nanoclusters of the layer of nanoclusters formed in the second area. In yet another form the forming of the first dielectric layer includes oxidizing material of the first sidewall and material of the lower surface.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a split gate memory device, the method comprising:
   forming a layer of select gate material over a substrate;
   patterning the layer of select gate material to form a first sidewall;
   forming a sacrificial spacer adjacent to the first sidewall;
   forming a layer of nanoclusters over the substrate including on the sacrificial spacer;
   removing the sacrificial spacer after the forming the layer of nanoclusters, wherein the removing removes nanoclusters of the layer of nanoclusters formed on the sacrificial spacer and leaves other nanoclusters of the layer of nanoclusters;
   forming a layer of control gate material over the substrate after the removing the sacrificial spacer; and
   forming a control gate of a split gate memory device from the layer of control gate material, wherein the control gate is located over nanoclusters of the layer of nanoclusters.

2. The method of claim 1 further comprising:
   forming a layer of dielectric material over the layer of nanoclusters after the removing of the sacrificial layer and prior to the forming the layer of control gate material.

3. The method of claim 1 further comprising:
   forming a layer of dielectric material on the first sidewall prior to the forming the sacrificial spacer.

4. The method of claim 3 wherein the forming a layer of dielectric material on the first sidewall includes growing an oxide layer on the first sidewall by oxidizing material of the first sidewall.

5. The method of claim 3 wherein:
the forming a layer of dielectric material includes forming a layer of dielectric material over the substrate in a first area adjacent to the first sidewall and where the layer of select gate material has been removed;
the sacrificial spacer is formed in the first area on the layer of dielectric material;
the forming the layer of nanoclusters includes forming nanoclusters on the layer of dielectric material in a second area of the first area adjacent to the sacrificial spacer; and
removing the sacrificial spacer leaves nanoclusters of the layer of nanoclusters in the second area.

6. The method of claim 5, wherein the split gate memory device includes a charge storage structure including nanoclusters of the layer of nanoclusters in the second area.

7. The method of claim 3 wherein the forming the sacrificial spacer includes forming a layer of spacer material on the layer of dielectric material.

8. The method of claim 3 wherein removing the sacrificial spacer includes etching the sacrificial spacer with an etch chemistry that is non selective to a material of the sacrificial spacer and does not etch a material of the layer of dielectric material.

9. The method of claim 1 wherein the forming a sacrificial spacer includes forming a sacrificial spacer that includes a nitride.

10. The method of claim 9 wherein the forming a sacrificial spacer includes forming a sacrificial spacer that includes titanium nitride.

11. The method claim 9 wherein the forming a sacrificial spacer includes forming a sacrificial spacer that includes silicon nitride.

12. The method of claim 1 wherein the forming a sacrificial spacer includes forming a sacrificial spacer that includes silicon germanium.

13. The method of claim 12 further comprising:
absorbing nanoclusters formed on the sacrificial spacer into the sacrificial spacer prior to the removing.

14. The method of claim 1 wherein the forming a sacrificial spacer includes forming a sacrificial spacer that includes amorphous carbon.

15. The method of claim 1 wherein the layer of nanoclusters include silicon.

16. The method of claim 1 wherein:
the patterning the layer of select gate material forms a second sidewall, the second sidewall is an opposite sidewall to the first sidewall; and
the first sidewall defines a first sidewall of a select gate of the split gate memory device and the second sidewall defines a second sidewall of the select gate.

17. The method of claim 1 wherein the control gate includes a base portion, wherein no nanoclusters of the layer of nanoclusters are located between the base portion and the first sidewall.

18. A method of forming a split gate memory device, the method comprising:
forming a first layer of dielectric material over a substrate;
forming a layer of select gate material over the first layer of dielectric material;
forming a select gate of a split gate memory device from the layer of select gate material wherein the forming a select gate includes patterning the layer of select gate material to form a first sidewall, wherein the patterning removes the layer of select gate material in a first area adjacent to the first sidewall;
forming a second dielectric layer on the first sidewall;
forming a sacrificial spacer on the second dielectric layer;
forming a layer of nanoclusters over the substrate including on the sacrificial spacer;
removing the sacrificial spacer with an etch chemistry that is selective to a material of the sacrificial spacer and does not etch a material of the second dielectric layer, wherein the removing removes nanoclusters of the layer of nanoclusters formed on the sacrificial spacer and leaves nanoclusters of the layer of nanoclusters formed in a second area of the first area outside a location of the sacrificial spacer, wherein a charge storage structure of the split gate memory device includes nanoclusters of the layer of nanoclusters in the second area;
forming a layer of control gate material over the substrate after the removing of the sacrificial layer including over nanoclusters of the layer of nanoclusters in the second area; and
forming a control gate of the split gate memory device from the layer of control gate material.

19. A method of making a semiconductor device, the method comprising:
patterning a wafer to form a gate having a first sidewall and a lower surface in a first area adjacent to the first sidewall of the gate;
forming a first dielectric layer on the first sidewall of the gate and over the lower surface;
forming a sacrificial spacer on the first dielectric layer adjacent to the first sidewall of the gate in the first area, the sacrificial spacer having a lateral thickness that defines a laterally adjacent buffer zone of separation from the gate;
forming a layer of nanoclusters on the wafer including on the sacrificial spacer and over a second area of the first area located adjacent to the sacrificial spacer; and
removing the sacrificial spacer using an etch chemistry that is selective to a material of the sacrificial spacer and does not etch a material of the first dielectric layer, wherein the removing of the sacrificial spacer removes nanoclusters of the layer of nanoclusters formed on the sacrificial spacer and from the laterally adjacent buffer zone of separation from the gate and leaves nanoclusters of the layer of nanoclusters formed in the second area.

20. The method of claim 19 wherein forming the first dielectric layer comprises oxidizing material of the first sidewall and material of the lower surface.

* * * * *